(12) United States Patent
Kim et al.

(10) Patent No.: US 12,495,574 B2
(45) Date of Patent: Dec. 9, 2025

(54) SEMICONDUCTOR DEVICES

(71) Applicant: Samsung Electronics Co., Ltd., Suwon-si (KR)

(72) Inventors: Kyungsoo Kim, Hwaseong-si (KR); Kyenhee Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 555 days.

(21) Appl. No.: 17/834,992

(22) Filed: Jun. 8, 2022

(65) Prior Publication Data
US 2023/0106015 A1 Apr. 6, 2023

(30) Foreign Application Priority Data
Oct. 5, 2021 (KR) .................. 10-2021-0131719

(51) Int. Cl.
*H10D 30/62* (2025.01)
*H01L 23/522* (2006.01)
(Continued)

(52) U.S. Cl.
CPC ..... *H10D 30/6219* (2025.01); *H01L 23/5226* (2013.01); *H01L 23/5283* (2013.01); *H10D 30/6211* (2025.01); *H10D 84/834* (2025.01)

(58) Field of Classification Search
CPC .......... H10D 30/6219; H10D 30/6211; H10D 84/834; H01L 21/76895; H01L 21/743; H01L 21/823475; H01L 21/823431; H01L 21/823412; H01L 21/823418; H01L 23/5226; H01L 23/5283; H01L 23/5286; H01L 23/535; H01L 27/0207; H01L 27/088; H01L 27/0886; H01L 29/1079;
(Continued)

(56) References Cited

U.S. PATENT DOCUMENTS 10,043,752 B2 8/2018 Lou et al.
10,607,938 B1 * 3/2020 Rubin ............... H01L 21/76802
(Continued)

FOREIGN PATENT DOCUMENTS

CN 112838058 A 5/2021
CN 112838163 A 5/2021
(Continued)

*Primary Examiner* — Teresa M. Arroyo
(74) *Attorney, Agent, or Firm* — Muir Patent Law, PLLC

(57) ABSTRACT

A semiconductor device, includes: a substrate including active regions extending in a first direction; gate electrodes extending in a second direction, intersecting the active regions; source/drain regions disposed in regions in which the active regions are recessed; buried interconnection lines disposed in the substrate; a first lower contact plug penetrating through a portion of the substrate, and connecting at least one of the source/drain regions and at least one of the buried interconnection lines; a second lower contact plug penetrating through a portion of the substrate, and connecting at least one of the gate electrodes and at least one of the buried interconnection lines; and upper contact plugs connected to a portion of the source/drain regions and a portion of the gate electrodes, wherein upper surfaces of the first and second lower contact plugs are disposed on a level lower than a level of upper surfaces of the gate electrodes.

20 Claims, 22 Drawing Sheets

(51) Int. Cl.
  *H01L 23/528* (2006.01)
  *H10D 84/83* (2025.01)
(58) Field of Classification Search
  CPC ............... H01L 29/0847; H01L 29/775; H01L 29/42392; H01L 29/0673; H01L 29/66439; H01L 29/78696; H01L 29/41725; H01L 29/41766; H01L 29/785; B82Y 10/00
  See application file for complete search history.

(56) References Cited

U.S. PATENT DOCUMENTS

| | | | |
|---|---|---|---|
| 10,636,739 B2 | 4/2020 | Beyne et al. | |
| 2007/0166925 A1 | 7/2007 | Takeda et al. | |
| 2010/0244934 A1 | 9/2010 | Botula et al. | |
| 2015/0060967 A1 | 3/2015 | Yokoyama et al. | |
| 2016/0379936 A1* | 12/2016 | Spitzlsperger | H01L 23/562 257/139 |
| 2018/0145030 A1 | 5/2018 | Beyne et al. | |
| 2020/0134128 A1* | 4/2020 | Peng | H01L 23/535 |
| 2020/0203276 A1 | 6/2020 | Hiblot et al. | |
| 2020/0373242 A1 | 11/2020 | Hiblot et al. | |
| 2020/0402909 A1 | 12/2020 | Hong et al. | |
| 2021/0202385 A1 | 7/2021 | Huang et al. | |
| 2021/0296577 A1 | 9/2021 | Kim et al. | |
| 2021/0305063 A1* | 9/2021 | Or-Bach | H01L 23/552 |

FOREIGN PATENT DOCUMENTS

| | | |
|---|---|---|
| KR | 1020020015298 A | 2/2002 |
| KR | 1020070019681 A | 2/2007 |
| KR | 100782488 B1 | 12/2007 |
| KR | 1020080000684 A | 1/2008 |
| KR | 1020180037662 A | 4/2018 |
| KR | 1020200065617 A | 6/2020 |

* cited by examiner

SEMICONDUCTOR DEVICES

CROSS-REFERENCE TO RELATED APPLICATION

This application claims benefit of priority under 35 U.S.C. § 119 to Korean Patent Application No. 10-2021-0131719, filed on Oct. 5, 2021, in the Korean Intellectual Property Office, the disclosure of which is incorporated herein by reference in its entirety.

BACKGROUND

The present inventive concept relates to a semiconductor device.

As a demand for high performance, high speed and/or multifunctionality of semiconductor devices, or the like, is increased, a degree of integration of semiconductor devices is increasing. In manufacturing a semiconductor device having a fine pattern, corresponding to a tendency for high integration of semiconductor devices, it is necessary to implement patterns having a fine width or a fine spacing distance. In addition, to overcome limitations of operating characteristics due to reductions in the size of a planar metal oxide semiconductor FET (MOSFET), efforts have been made to develop a semiconductor device including a FinFET having a channel having a three-dimensional structure.

SUMMARY

An aspect of the present inventive concept is to provide a semiconductor device having improved a degree of integration and reliability.

According to an aspect of the present inventive concept, a semiconductor device, may include: a substrate including active regions extending in a first direction; gate electrodes extending in a second direction, intersecting the active regions on the substrate; source/drain regions disposed in regions in which the active regions are recessed on both sides of the gate electrodes; buried interconnection lines disposed in the substrate; a first lower contact plug penetrating through a portion of the substrate, and connecting at least one of the source/drain regions and at least one of the buried interconnection lines; a second lower contact plug penetrating through a portion of the substrate, and connecting at least one of the gate electrodes and at least one of the buried interconnection lines; and upper contact plugs connected to a portion of the source/drain regions and a portion of the gate electrodes on the substrate, wherein levels of upper surfaces of the first and second lower contact plugs are lower than a level of upper surfaces of the gate electrodes.

According to an aspect of the present inventive concept, a semiconductor device, may include: a substrate including active regions spaced apart from each other and extending in a first direction; gate electrodes extending in a second direction, intersecting the active regions on the substrate; source/drain regions disposed in regions in which the active regions are recessed on both sides of the gate electrodes and including first and second source/drain regions; a first buried interconnection line disposed in the substrate; a first lower contact plug penetrating through a portion of the substrate, and connecting the first source/drain region and the first buried interconnection line; and an upper contact plug connected to the second source/drain region on the substrate, wherein a level of an upper surface of the first lower contact plug is lower than a level of upper surfaces of the gate electrodes, and a level of an upper surface of the upper contact plug is higher than the level of the upper surfaces of the gate electrodes.

According to an aspect of the present inventive concept, a semiconductor device, may include: a substrate including active regions extending in a first direction; gate electrodes extending in a second direction, intersecting the active regions on the substrate; source/drain regions disposed in regions in which the active regions are recessed on both sides of the gate electrodes; buried interconnection lines disposed in the substrate; upper interconnection lines disposed on the substrate, and including a power transmission line; a first lower contact plug penetrating through a portion of the substrate, and connecting at least one of the source/drain regions and at least one of the buried interconnection lines; a second lower contact plug penetrating through a portion of the substrate, and connecting at least one of the gate electrodes and at least one of the buried interconnection lines; a third lower contact plug penetrating through a portion of the substrate, and connecting the power transmission line and at least one of the buried interconnection lines; and upper contact plugs connected to a portion of the source/drain regions and a portion of the gate electrodes on the substrate, wherein levels of upper surfaces of the first and second lower contact plugs are lower than a level of an upper surface of the third lower contact plug.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred embodiments of the present inventive concept will be described with reference to the accompanying drawings. Like numerals refer to like elements throughout.

Figure 1:
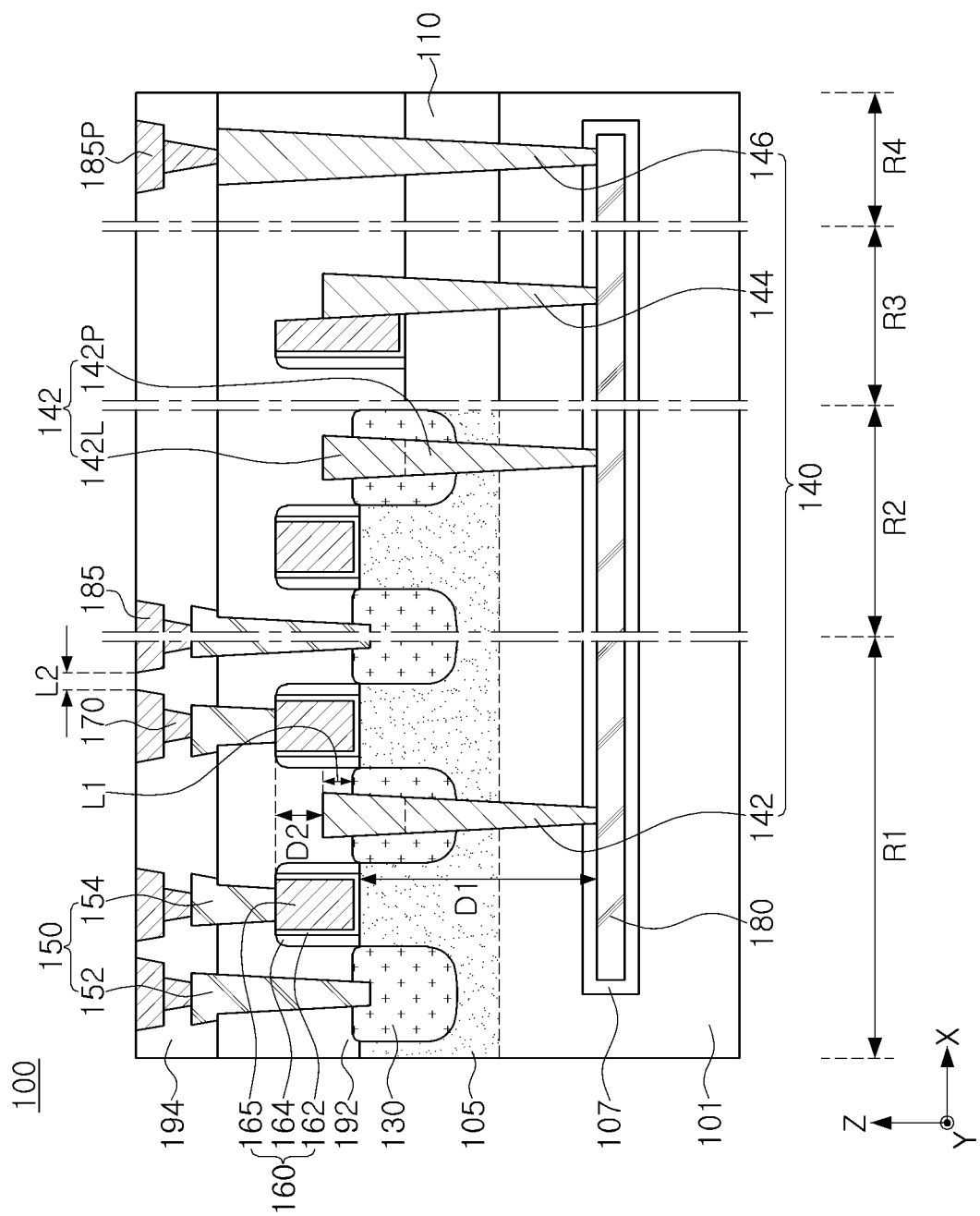
FIGS. 1 and 2 are schematic cross-sectional views and partially cut-away perspective views illustrating a semiconductor device, according to example embodiments.
Figure 2:
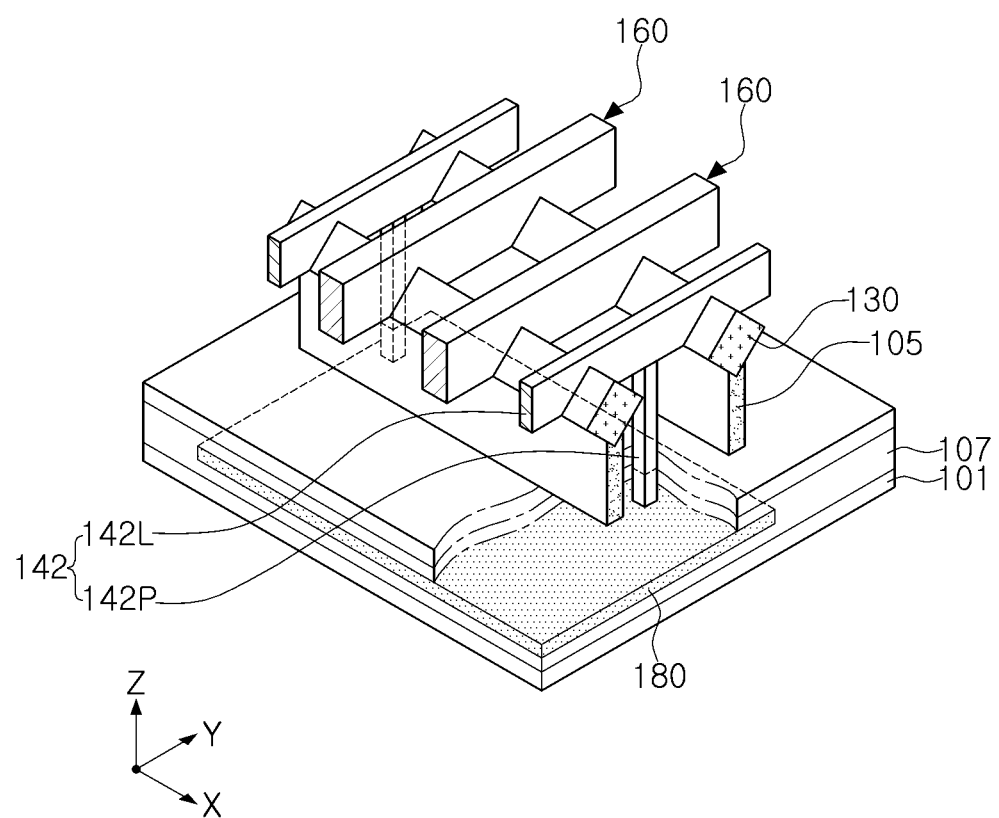

FIGS. 1 and 2 are schematic cross-sectional views and partially cut-away perspective views illustrating a semiconductor device according to example embodiments. FIG. 2 is a partial cutaway view of a portion of FIG. 1.

Referring to FIGS. 1 and 2, the semiconductor device 100 may include a substrate 101 including active regions 105, gate electrodes 165 extending to cross the active regions 105, source/drain regions 130 disposed in regions in which the active regions 105 are recessed on both sides of the gate electrodes 165, a buried interconnection line 180 disposed in the substrate 101, and lower contact plugs 140 connected to the buried interconnection line 180. The semiconductor device 100 may further include a substrate insulating layer 107, a gate dielectric layer 162 and gate spacer layers 164, a device isolation layer 110, first and second interlayer insulating layers 192 and 194, upper contact plugs 150, vias 170, and upper interconnection lines 185. The gate dielectric layer 162, gate spacer layers 164, and gate electrodes 165 may constitute the gate structure 160.

The substrate 101 may have an upper surface extending in X and Y directions. The substrate 101 may include a semiconductor material, such as a Group IV semiconductor, a Group III-V compound semiconductor, or a Group II-VI compound semiconductor. For example, the group IV semiconductor may include silicon (Si), germanium (Ge), or silicon germanium (SiGe). The substrate 101 may be provided as a bulk wafer, an epitaxial layer, a silicon on insulator (SOI) layer, a semiconductor on insulator (SeOI) layer, or the like.

The substrate 101 may include active regions 105 disposed in an upper portion thereof. However, according to the description, the active regions 105 may be described as a separate configuration from the substrate 101. The substrate 101 may have first to fourth regions R1, R2, R3, and R4. The first to fourth regions R1, R2, R3, and R4 may be regions, adjacent to or spaced apart from each other.

The active regions 105 may be disposed to extend lengthwise in a first direction, for example, an X direction. The active regions 105 may be defined to have a predetermined depth from an upper surface of the substrate 101. The active regions 105 may be formed as a portion of the substrate 101, or may include an epitaxial layer grown from the substrate 101. Each of the active regions 105 may include active fins protruding upwardly. The device isolation layer 110 may be disposed between the active regions 105 adjacent in a Y direction. Upper surfaces of the active regions 105 below the gate structure 160 may be disposed on a vertical level higher than that of an upper surface of the device isolation layer 110. The active regions 105 may be partially recessed to form recessed regions on both sides of the gate structures 160, and source/drain regions 130 may be respectively disposed in the recessed regions.

The active regions 105 may be impurity regions. The impurity region may form at least a portion of a well region of a transistor. Accordingly, in the case of a p-type transistor (pFET), the impurity region may include n-type impurities such as phosphorus (P), arsenic (As), or antimony (Sb), and in the case of an n-type transistor (nFET), the impurity region may include p-type impurities such as boron (B), gallium (Ga), or aluminum (Al). In some example embodiments, the well region may extend below the buried interconnection lines 180. In this case, a lower end of the well region may be disposed on a level lower than that of lower surfaces of the buried interconnection lines 180, and the buried interconnection lines 180 may be surrounded by the well region.

The device isolation layer 110 may fill a space between the active regions 105, and define the active regions 105 in the substrate 101. The device isolation layer 110 may be formed by, for example, a shallow trench isolation (STI) process. In particular, the device isolation layer 110 may fill a space between active fins of the active regions 105. In some example embodiments, the device isolation layer 110 may have a step difference in some regions and may extend deeper toward the substrate 101. The device isolation layer 110 may expose an upper surface of the active region 105, and may partially expose an upper portion of the active region 105. For example, an upper surface of the device isolation layer 110 may be at a level lower than the upper surface of the active region 105. The device isolation layer 110 may be formed of an insulating material. The device isolation layer 110 may be, for example, an oxide, a nitride, or a combination thereof.

The source/drain regions 130 may be respectively disposed on the active regions 105 on both sides of the gate structures 160. The source/drain regions 130 may be disposed in recessed regions in which an upper portion of the active regions 105 are partially recessed. Upper surfaces of the source/drain regions 130 may be disposed on the same or a similar level to lower surfaces of the gate structures 160, and a level of the upper surfaces of the source/drain regions 130 may vary in example embodiments. In some example embodiments, the source/drain regions 130 may be connected to or merged with each other on two or more active regions 105 adjacent in the Y direction to form a single source/drain region 130.

The gate structures 160 may be disposed on the active regions 105 to cross the active regions 105 and extend lengthwise in a second direction, for example, the Y-direction. Channel regions of transistors may be formed in the active regions 105 intersecting the gate electrode 165 of the gate structure 160. The gate structure 160 may include a gate electrode 165, a gate dielectric layer 162 between the gate electrode 165 and the active region 105, and gate spacer layers 164 on side surfaces of the gate electrode 165. In some example embodiments, the gate structure 160 may further include a capping layer on an upper surface of the gate electrode 165. Alternatively, a portion of the first interlayer insulating layer 192 on the gate structure 160 may be referred to as a gate capping layer.

The gate dielectric layer 162 may be disposed between the active region 105 and the gate electrode 165. The gate dielectric layer 162 may include an oxide, a nitride, or a high dielectric constant (high-k) material. The high-k material may mean a dielectric material having a dielectric constant, higher than that of silicon oxide ($SiO_2$). The high-k material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). According to example embodiments, the gate dielectric layer 162 may be formed of a multilayer film.

The gate electrode 165 may include a conductive material, and may include, for example, a metal nitride such as a titanium nitride film (TiN), a tantalum nitride film (TaN), or a tungsten nitride film (WN), and/or a metal material such as aluminum (Al), tungsten (W), molybdenum (Mo), or the like, or a semiconductor material such as doped polysilicon. The gate electrodes 165 may be formed of two or more multilayer structures. According to example embodiments, the gate electrode 165 may be formed of two or more multi-layers.

The gate spacer layers 164 may be disposed on both side surfaces of the gate electrode 165. The gate spacer layers 164 may be formed between the gate dielectric layer 162 and the first interlayer insulating layer 192. The gate spacer layers 164 may insulate the source/drain regions 130 and the gate electrodes 165 from each other. According to example embodiments, the gate spacer layers 164 may be formed of a multilayer structure. The gate spacer layers 164 may be comprised of oxides, nitrides, and oxynitrides, and may be comprised of, particularly, a low dielectric constant film.

The first and second interlayer insulating layers 192 and 194 may be disposed to cover upper surfaces of the source/drain regions 130 and the gate structures 160, and to cover the device isolation layer 110. The first and second interlayer insulating layers 192 and 194 may include at least one of an oxide, a nitride, and an oxynitride, and may include, for example, a low-k material. According to example embodiments, each of the first and second interlayer insulating layers 192 and 194 may include a plurality of insulating layers.

The upper contact plugs 150 may include first and second upper contact plugs 152 and 154 penetrating through the first interlayer insulating layer 192. Upper surfaces of the first and second upper contact plugs 152 and 154 may be disposed on a level higher than that of an upper surface of the first interlayer insulating layer 192. The first upper contact plugs 152 may be connected to the source/drain regions 130 to apply an electrical signal to the source/drain regions 130. The second upper contact plugs 154 may be connected to the gate electrodes 165 to apply an electrical signal to the gate electrodes 165.

Upper surfaces of the upper contact plugs 150 may be disposed on a level higher than that of upper surfaces of the gate structures 160. Lower surfaces of the upper contact plugs 150 may be positioned above lower surfaces of the active regions 105. The upper contact plugs 150 may have a relatively wide width in upper regions surrounded by the second interlayer insulating layer 194. For example, the upper contact plugs 150 may have side surfaces expanding in at least one horizontal direction, for example, a direction in which the lower contact plugs 140 are disposed, on an upper surface of the first interlayer insulating layer 192. Accordingly, a width of the upper surface of the upper contact plugs 150 may be greater than a width of the lower surface of the upper contact plugs 150. However, in example embodiments, specific shapes of the upper regions of the upper contact plugs 150 may be variously altered. The upper contact plugs 150 may have inclined side surfaces in which a width in a lower portion becomes narrower than a width in an upper portion according to an aspect ratio, but an example embodiment thereof is not limited thereto.

The first upper contact plugs 152 may be disposed to partially recess the source/drain regions 130. For example, lower surfaces of the first upper contact plugs 152 may be at a lower level than upper surfaces of the source/drain regions 130. However, according to example embodiments, the first upper contact plugs 152 may be disposed to contact the upper surfaces of the source/drain regions 130 without recessing the source/drain regions 130.

The upper contact plug 150 may include a metal silicide layer disposed at a lower end including a lower surface, and may further include a barrier layer disposed on an upper surface and sidewalls of the metal silicide layer. The barrier layer may include, for example, a metal nitride such as a titanium nitride layer (TiN), a tantalum nitride layer (TaN), or a tungsten nitride layer (WN). The upper contact plugs 150 may include, for example, a metal material such as aluminum (Al), tungsten (W), or molybdenum (Mo). In example embodiments, the number and a dispositional form of conductive layers constituting the upper contact plugs 150 may be variously altered.

The vias 170 may be disposed on the upper contact plugs 150 and the third lower contact plug 146. For example, lower surfaces of the vias 170 may contact upper surfaces of the upper contact plugs 150 and the third lower contact plug 146. However, in some example embodiments, the vias 170 may be omitted. In this case, the upper contact plugs 150 and the third lower contact plug 146 may be directly connected to the upper interconnection lines 185 through regions protruding upwardly from each of the upper contact plugs 150 and the third lower contact plug 146.

The upper interconnection lines 185 may be disposed on the vias 170 to be electrically connected to the upper contact plugs 150 and the third lower contact plug 146. For example, lower surfaces of the upper interconnection lines 185 may contact upper surfaces of the vias 170. Among the upper interconnection lines 185, power interconnection lines 185P connected to the third lower contact plug 146 may be power interconnection lines for applying power or a ground voltage.

The vias 170 and the upper interconnection lines 185 may include a conductive material, for example, a metal material such as aluminum (Al), tungsten (W), copper (Cu), or molybdenum (Mo).

The buried interconnection lines 180 may be disposed in a buried form in the substrate 101. For example, the buried interconnection lines 180 may be formed at least partially below a top surface of the substrate 101, and may be surrounded by at least a portion of the substrate 101. Specifically, the buried interconnection lines 180 may be disposed below the active regions 105. The buried interconnection lines 180 may be disposed on a level lower than that of a lower end or a lower surface of the active regions 105 or active fins indicated by dotted lines in FIG. 1. The buried interconnection lines 180 may be disposed at a first depth D1 from the upper surface of the active regions 105 or the upper surface of the substrate 101. The first depth D1 may be, for example, in a range of about 10 nm to about 200 nm. In example embodiments, a level of the lower surfaces of the buried interconnection lines 180 may be higher than a level of a lower end or a lower surface of the well region in the substrate 101 described above, but an example embodiment thereof is not limited thereto.

The buried interconnection lines 180 may extend in X and Y directions and may be disposed in a form of a plate having a relatively small thickness in a Z direction, and a specific shape of the buried interconnection lines 180 in a plan view may be variously altered according to a circuit configuration of the semiconductor device 100. The buried interconnection lines 180 in the first to fourth regions R1, R2, R3, and R4 may be separated, or portions of the buried interconnection lines 180 in the first to fourth regions R1, R2, R3, and R4 may be connected. A thickness of the buried interconnection lines 180 may be, for example, in a range of about 20 nm to about 120 nm. In some example embodiments, the buried interconnection lines 180 may include buried interconnection lines 180 positioned at different levels in the Z direction. The buried interconnection lines 180 may include a conductive material, for example, a metal material such as ruthenium (Ru), cobalt (Co), copper (Cu), tungsten (W), aluminum (Al), molybdenum (Mo), or the like. As used herein, thickness may refer to the thickness or height measured in a direction perpendicular to a top surface of the substrate 101 (e.g., in a Z direction).

The substrate insulating layer 107 may be positioned in the substrate 101, and may be disposed to surround the buried interconnection lines 180. For example, the substrate insulating layer 107 may be disposed to cover upper surfaces, lower surfaces, and side surfaces of the buried interconnection lines 180. The substrate insulating layer 107 may electrically isolate the buried interconnection lines 180 from the substrate 101. The substrate insulating layer 107 may include an insulating material, for example, may include at least one of silicon oxide, silicon nitride, and silicon oxynitride.

The lower contact plugs 140 may penetrate through a portion of the substrate 101 including the active regions 105 to be connected to the buried interconnection line 180, and may include first to third lower contact plugs 142, 144, and 146. For example, each of the first to third lower contact plugs 142, 144, and 146 may contact the buried interconnection line 180. The lower contact plugs 140 may further penetrate through the substrate insulating layer 107 on the buried interconnection line 180, and a portion thereof may penetrate through the device isolation layer 110. The first lower contact plugs 142 may be connected to the source/drain regions 130 to apply an electrical signal to the source/drain regions 130. In example embodiments, the first lower contact plugs 142 may contact the source/drain regions 130. The second lower contact plug 144 may be connected to the gate electrode 165 to apply an electrical signal to the gate electrode 165. In example embodiments, the second lower contact plug 144 may contact the gate electrode 165. The third lower contact plug 146 may be connected to a power interconnection line 185P among the upper interconnection lines 185, and more specifically, may be connected to the power interconnection line 185P through the via 170. For example, the third lower contact plug 146 may contact the via 170. In some example embodiments, a portion of the lower contact plugs 140 may be directly connected to the upper contact plugs 150 such as the first upper contact plug 152. For example, one or more of the lower contact plugs 140 may contact one or more of the upper contact plugs 150.

A width of an upper surface the lower contact plugs 140 may be greater than a width of a lower surface of the lower contact plugs 140. The lower contact plugs 140 may have inclined side surfaces in which a width of a lower portion becomes narrower than a width of an upper portion according to an aspect ratio, but an example embodiment thereof is not limited thereto. A level of upper surfaces of the first and second lower contact plugs 142 and 144 of the lower contact plugs 140 may be lower than a level of upper surfaces of the gate electrode 165 or the gate structures 160 by a second depth D2. The second depth D2 may be, for example, in a range of about 1 nm to about 20 nm. The upper surfaces of the first and second lower contact plugs 142 and 144 may be disposed on a level lower than that of upper surfaces of the upper contact plugs 150. Due to positions of the upper surfaces of the first and second lower contact plugs 142 and 144 as described above, the first and second lower contact plugs 142 and 144 may be stably electrically isolated from the gate electrodes 165 and the upper contact plugs 150, adjacent with each other.

As illustrated in FIG. 2, at least a portion of the lower contact plugs 140, for example, the first lower contact plug 142, may include a cylindrical plug region 142P and a line region 142L on the plug region 142P. The line region 142L may be disposed to extend in a predetermined length in one direction, for example, in a Y direction, to connect the adjacent source/drain regions 130. However, in some example embodiments, the lower contact plugs 140 may not include a line region 142L, or an entirety thereof may be formed of a plug region.

In some example embodiments, a portion of the lower contact plugs 140, for example, the third lower contact plug 146 may have a shape in which a trench extending in one direction is filled.

The first lower contact plugs 142 may penetrate through at least a portion of the source/drain regions 130. In the present example embodiment, the first lower contact plugs 142 may penetrate through entire source/drain regions 130 in a Z direction, so that upper surfaces of the first lower contact plugs 142 may be disposed on a level, higher than that of upper surfaces of the source/drain regions 130. However, the present inventive concept is not limited thereto. Upper surfaces of the first lower contact plugs 142 may be disposed on a level higher than that of lower surfaces of the source/drain regions 130, and may be covered with a first interlayer insulating layer 192. In example embodiments, the first lower contact plugs 142 may electrically connect the source/drain region 130 of a first region R1 to the source/drain region 130 of a second region R2. In example embodiments, the first lower contact plugs 142 connect the source/drain region 130 of the first region R1 and/or the second region R2 to the power interconnection line 185P, through the buried interconnection line 180 and the third lower contact plug 146.

The second lower contact plug 144 may be connected to the gate electrode 165, and the gate electrode 165 may have a shape in which a portion is removed in a region connected to the second lower contact plug 144. Accordingly, the second lower contact plug 144 may contact a side surface of the gate electrode 165, and an upper surface of the second lower contact plug 144 may be covered with the first interlayer insulating layer 192. The second lower contact plug 144 may be connected to the gate electrode 165 in a region where the gate structure 160 is disposed on the device isolation layer 110. In example embodiments, the second lower contact plug 144 may electrically connect the gate electrode 165 in the third region R3 to the source/drain region 130 in a first region R1 and/or a second region R2, or may be electrically connected to a gate electrode 165 in a region not shown.

The third lower contact plug 146 may penetrate through the entire first interlayer insulating layer 192 to be connected to the via 170. For example, an upper surface of the third lower contact plug 146 may be coplanar with an upper surface of the first interlayer insulating layer 192, and a lower surface of the third lower contact plug 146 may be at a level lower than that of a lower surface of the first interlayer insulating layer 192. An upper surface of the third lower contact plug 146 may be disposed on a level higher than that of upper surfaces of the first and second lower contact plugs 142 and 144. The upper surface of the third lower contact plug 146 may be disposed on a level between the upper surfaces of the first and second lower contact plugs 142 and 144 and the upper surfaces of the upper contact plugs 150. In example embodiments, the third lower contact plug 146 may connect the buried interconnection line 180 and the power interconnection line 185P together with the via 170 in a fourth region R4.

The lower contact plugs 140 may include a conductive material, for example, a metal material such as ruthenium (Ru), cobalt (Co), copper (Cu), tungsten (W), aluminum (Al), or molybdenum (Mo), or semiconductor materials such as polycrystalline silicon. Similar to the upper contact plugs 150, the lower contact plugs 140 may further include a barrier layer disposed on a bottom surface and sidewalls of the lower contact plugs 140.

Since the semiconductor device 100 includes the buried interconnection line 180 and the lower contact plugs 140 connected to the buried interconnection line 180, a degree of integration may be increased and a separation distance between the upper interconnection lines 185 may be secured. Also, by having a structure in which a dispositional level of each of the buried interconnection line 180 and the lower contact plugs 140 is optimized, reliability may be secured.

Figure 3A:
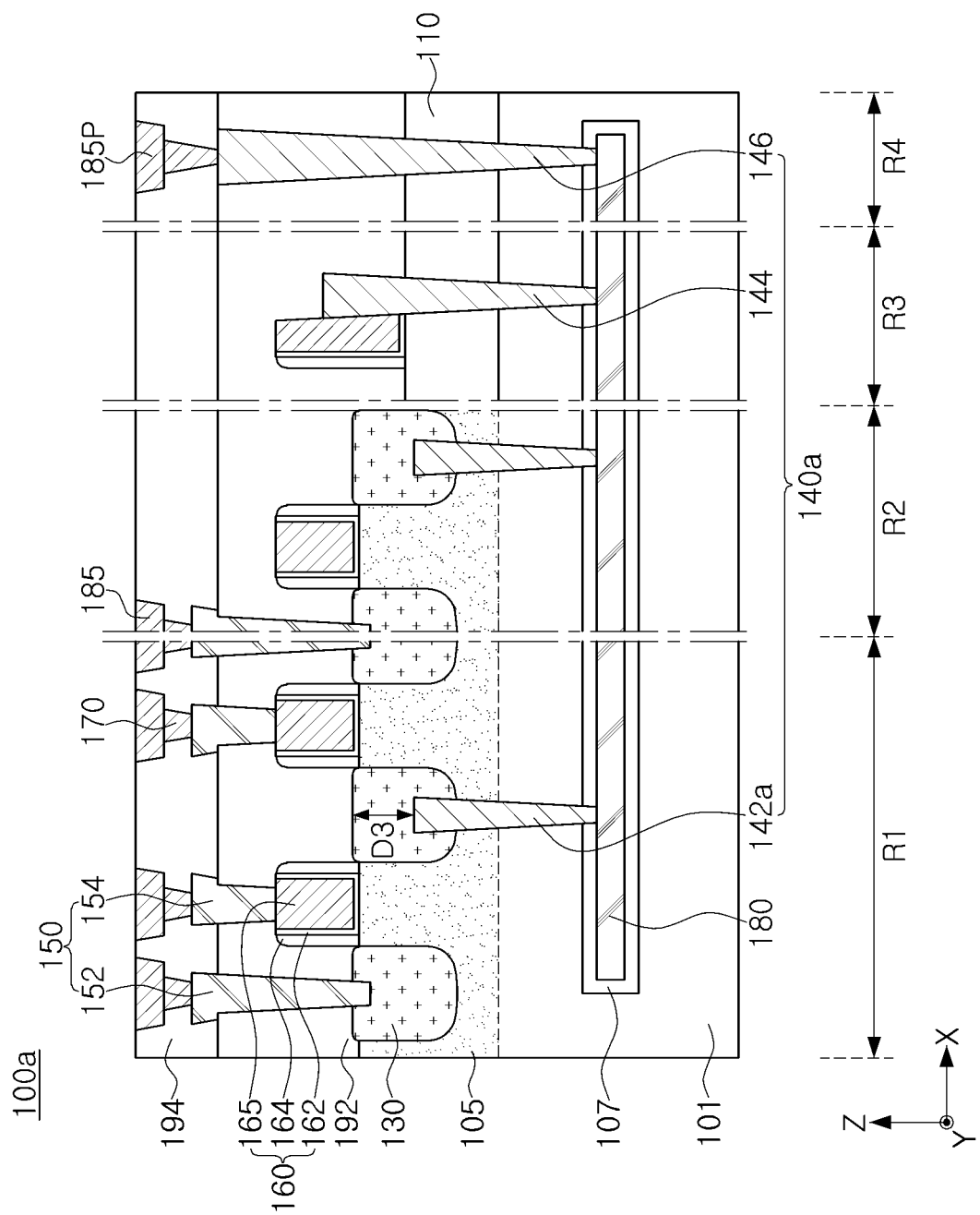
FIGS. 3A and 3B are schematic cross-sectional views illustrating a semiconductor device, according to example embodiments.
Figure 3B:
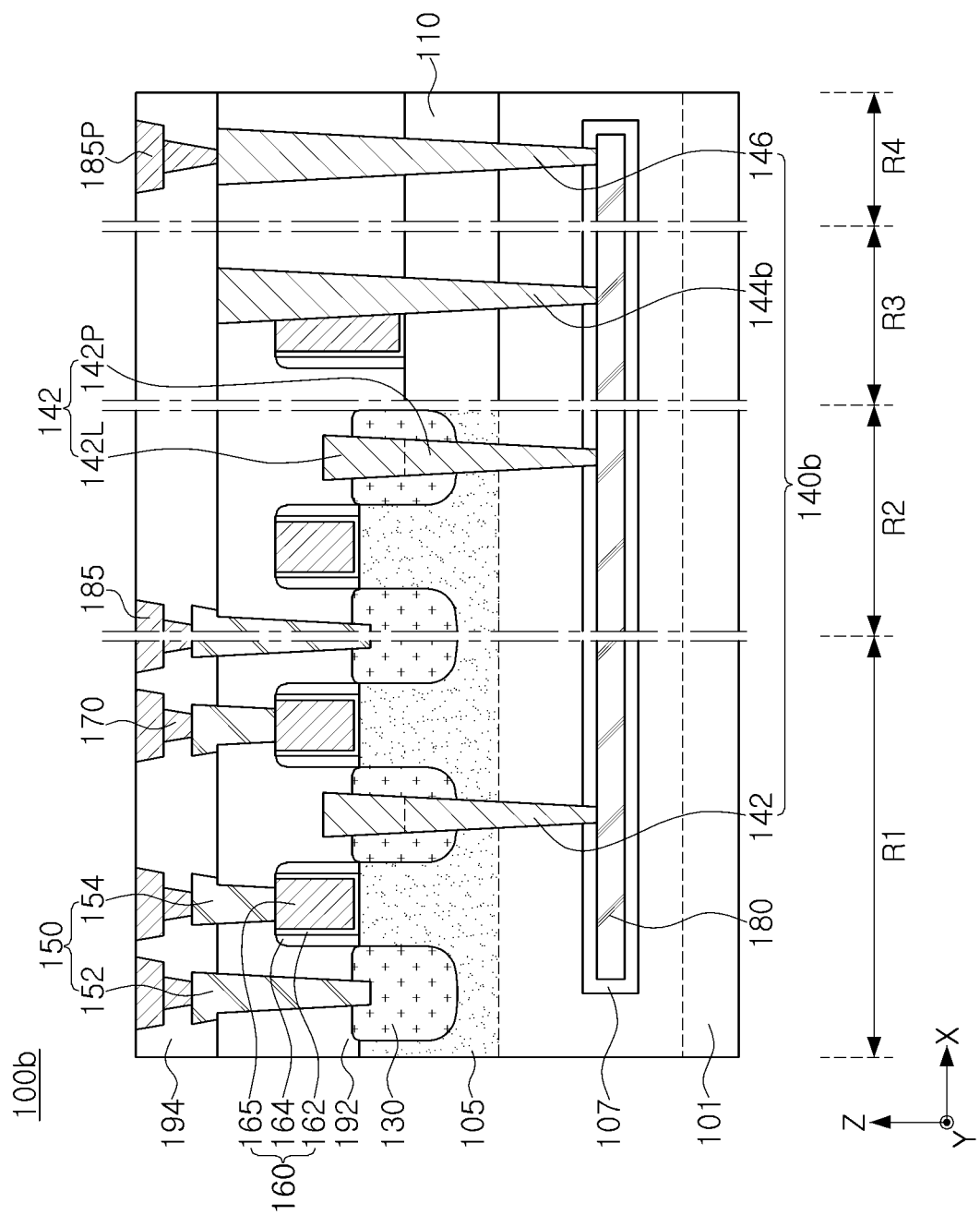

FIGS. 3A and 3B are schematic cross-sectional views illustrating semiconductor devices according to example embodiments. Hereinafter, descriptions overlapping with those described above with reference to FIGS. 1 and 2 will be omitted.

Referring to FIG. 3A, in a semiconductor device 100a, heights of the first lower contact plugs 142a among the lower contact plugs 140a may be different from those of the embodiments of FIGS. 1 and 2. Upper surfaces of the first lower contact plugs 142a may be disposed on a level lower than that of upper surfaces of the source/drain regions 130 and may be located in the source/drain regions 130. For example, upper surfaces of the first lower contact plugs 142a may be covered by the source/drain regions 130. Also, unlike in the example embodiment of FIGS. 1 and 2, the first lower contact plugs 142a may only have a region corresponding to the plug region 142P of FIGS. 1 and 2, and thus an entirety of first lower contact plugs 142a may have a plug shape. The upper surfaces of the first lower contact plugs 142a may be disposed at a third depth D3 from the upper surfaces of the source/drain regions 130. The third depth D3 may be determined according to, for example, a thickness of the source/drain regions 130. In some example embodiments, upper surfaces of the first lower contact plugs 142a may be covered with the first interlayer insulating layer 192. In this case, the first interlayer insulating layer 192 may have regions protruding into the source/drain regions 130 toward the first lower contact plugs 142a.

In the present example embodiment, upper surfaces of first to third lower contact plugs 142a, 144, and 146 of the lower contact plugs 140a may be disposed on different levels. The upper surfaces of the first lower contact plugs 142a may be disposed on a level lower than that of the upper surfaces of the second lower contact plugs 144, and the upper surface of the second lower contact plugs 144 may be disposed on a level lower than that of the upper surface of the third lower contact plug 146.

Referring to FIG. 3B, in a semiconductor device 100b, a height of the second lower contact plug 144b among the lower contact plugs 140b may be different from that in the example embodiments of FIGS. 1 and 2. An upper surface of the second lower contact plug 144b may be disposed on a level higher than that of upper surfaces of the gate electrode 165 and the gate structure 160. For example, the upper surface of the second lower contact plug 144b may be disposed on the same level as the upper surface of the third lower contact plug 146.

As in the example embodiments of FIGS. 3A and 3B, in example embodiments, the levels of the upper surfaces of the first to third lower contact plugs 142, 144, and 146 may be variously altered.

Figure 4:
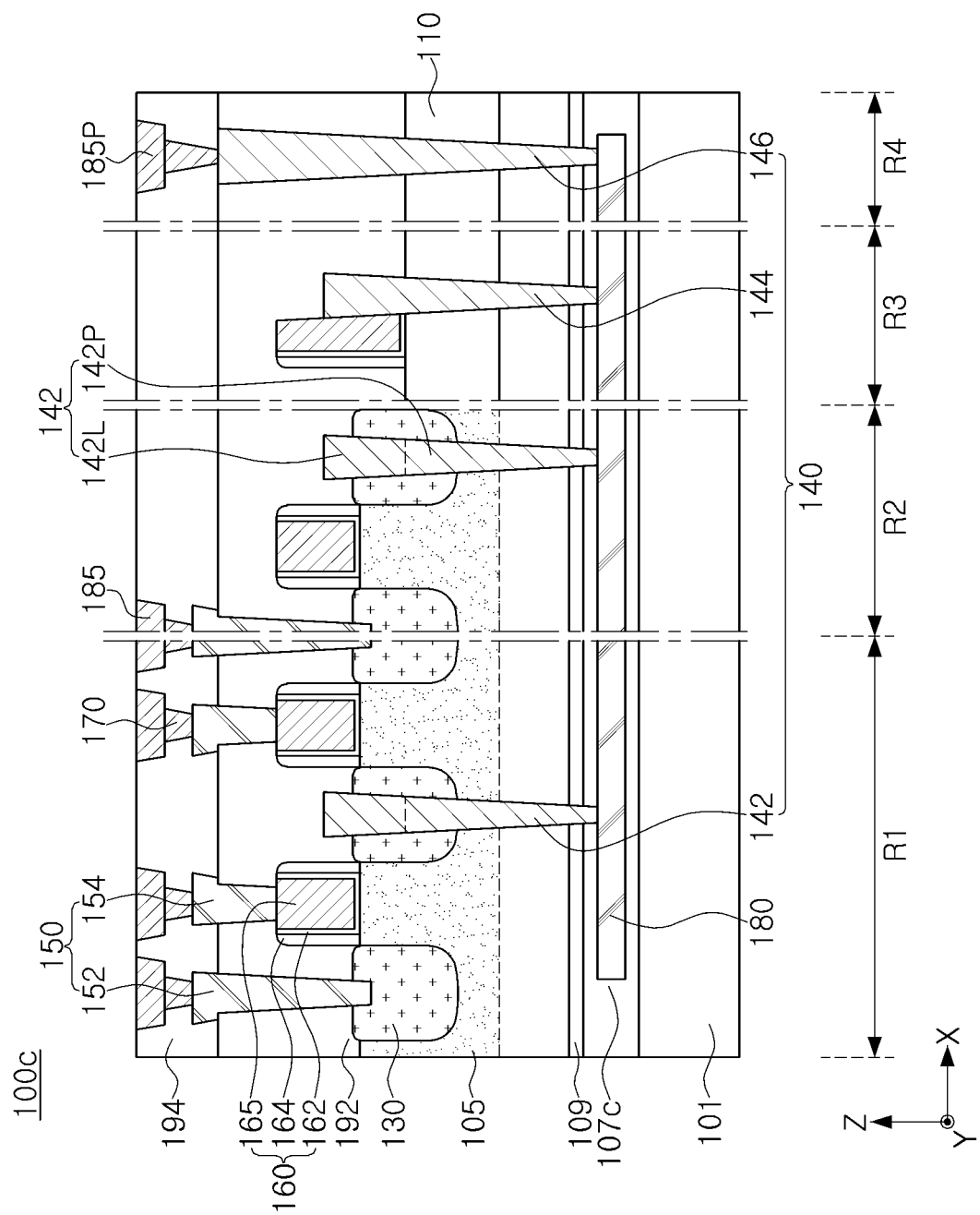
FIG. 4 is a schematic cross-sectional view illustrating a semiconductor device, according to example embodiments.

FIG. 4 is a schematic cross-sectional view illustrating a semiconductor device according to example embodiments.

Referring to FIG. 4, in a semiconductor device 100c, a shape of a substrate insulating layer 107c may be different from that of the example embodiments of FIGS. 1 and 2. In addition, the semiconductor device 100c may further include a bonding insulating layer 109 on the substrate insulating layer 107c. The substrate insulating layer 107c may cover upper surfaces, lower surfaces, and side surfaces of the buried interconnection lines 180 and may extend in X and Y directions. The bonding insulating layer 109 is a layer bonded to the substrate insulating layer 107c, and may include an insulating material. For example, the substrate insulating layer 107c and the bonding insulating layer 109 may include, for example, at least one of SiO, SiN, SiCN, SiOC, SiON, and SiOCN.

In the present example embodiment, the substrate 101 may be formed by bonding a lower region disposed below the substrate insulating layer 107c and an upper region disposed on the bonding insulating layer 109 by dielectric-to-dielectric bonding. Accordingly, the substrate 101 may have a structure in which the substrate insulating layer 107c and the bonding insulating layer 109 are directly bonded without interposing a separate adhesive layer.

Figure 5A:
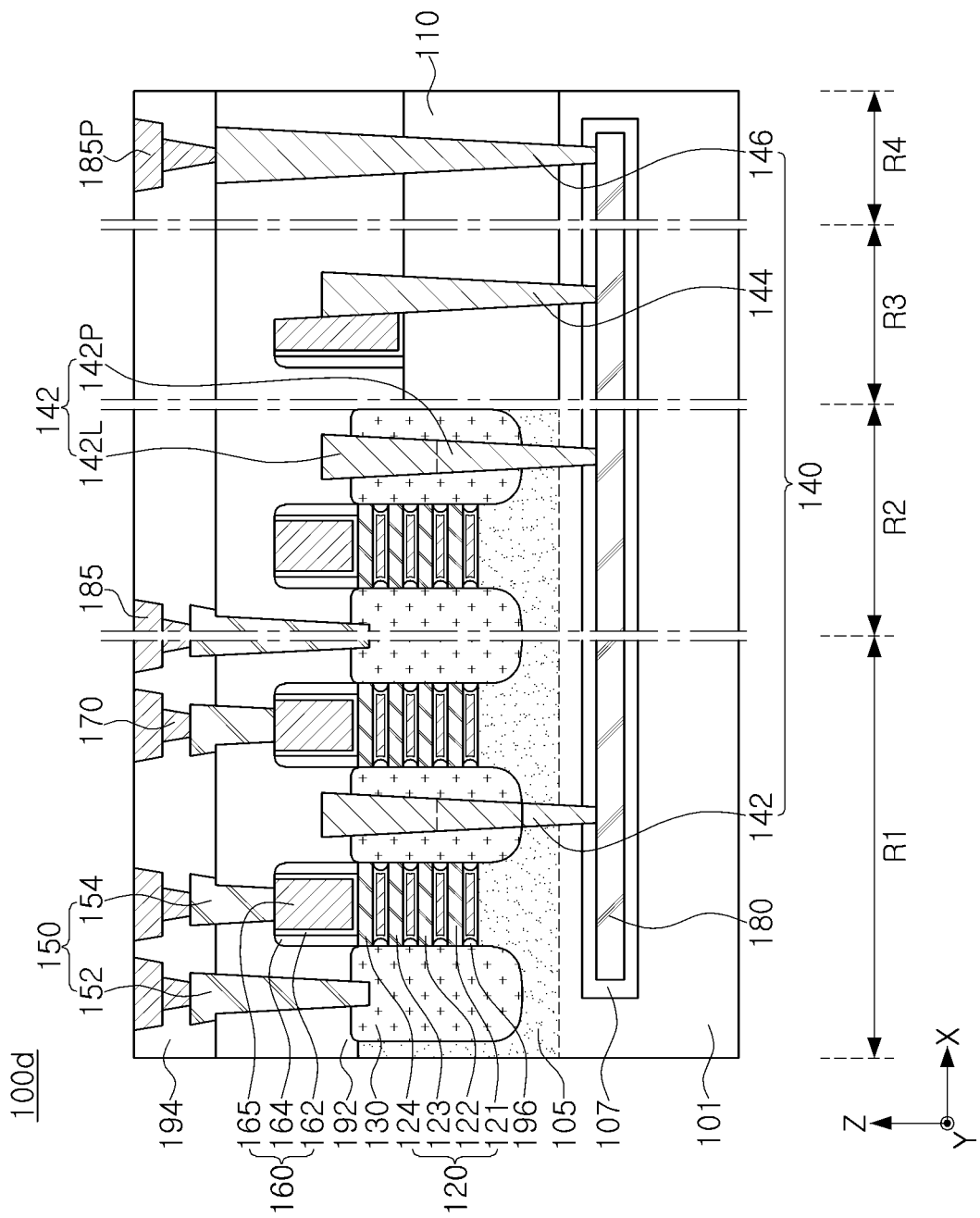
FIGS. 5A and 5B are schematic cross-sectional views illustrating a semiconductor device, according to example embodiments.
Figure 5B:
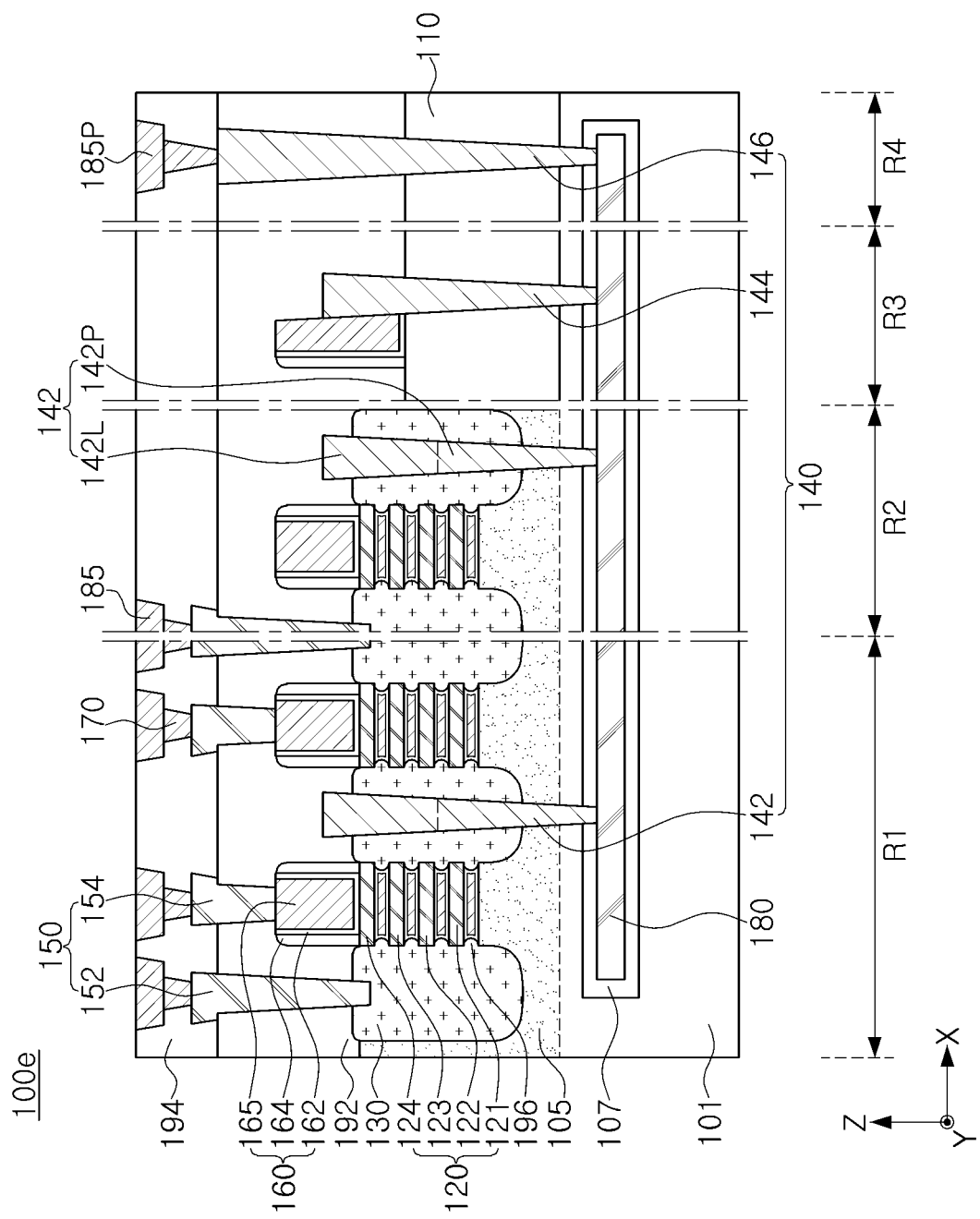

FIGS. 5A and 5B are schematic cross-sectional views illustrating a semiconductor device according to example embodiments.

Referring to FIG. 5A, a semiconductor device 100d may further include channel structures 120 and inner spacer layers 196. In the semiconductor device 100d, the active region 105 has a fin structure, and a gate electrode 165 may be disposed between the active region 105 and the channel structures 120, between first to fourth channel layers 121, 122, 123, and 124 of the channel structures 120, and on the channel structures 120. Accordingly, the semiconductor device 100d may include a transistor having a multi-bridge channel FET (MBCFET™) structure, which is a gate-all-around field effect transistor.

The channel structures 120 may include first to fourth channel layers 121, 122, 123, and 124, two or more channel layers, disposed on the active regions 105 to be spaced apart from each other in a direction perpendicular to an upper surface of the active regions 105, for example, in a Z direction. The first to fourth channel layers 121, 122, 123, and 124 may be spaced apart from the upper surface of the active region 105 while being connected to the source/drain regions 130. The first to fourth channel layers 121, 122, 123, and 124 may have the same or similar width as the active region 105 in the Y direction, and may have the same or similar width as the gate structure 160 in the X direction. For example, in some example embodiments, the first to fourth channel layers 121, 122, 123, and 124 may have a narrower width than the gate structure 160 such that side surfaces thereof are disposed below the gate structure 160 in the x direction.

The first to fourth channel layers 121, 122, 123, and 124 may be formed of a semiconductor material, and may include, for example, at least one of silicon (Si), silicon germanium (SiGe), and germanium (Ge). The first to fourth channel layers 121, 122, 123, and 124 may be formed of, for example, the same material as the substrate 101. According to example embodiments, the first to fourth channel layers 121, 122, 123, and 124 may include an impurity region disposed in a region adjacent to the source/drain regions 130. The number and shape of the first to fourth channel layers 121, 122, 123, and 124 of each of the channel structures 120 may be variously altered in example embodiments. For example, in some example embodiments, the channel structures 120 may further include a channel layer disposed on the upper surface of the active region 105.

The source/drain regions 130 may be in contact with the channel structures 120, and may be disposed to cover side surfaces of each of the first to fourth channel layers 121, 122, 123, and 124. The gate electrode 165 may be disposed above the active region 105 to extend onto the channel structures 120 while filling a space between the first to fourth channel layers 121, 122, 123, and 124. The gate electrode 165 may be spaced apart from the first to fourth channel layers 121, 122, 123, and 124 and the active regions 105 by the gate dielectric layer 162. In the present example embodiment, channel regions of transistors may be formed in the active regions 105 and/or the channel structures 120 intersecting the gate electrode 165 of the gate structure 160.

The inner spacer layers 196 may be disposed between the first to fourth channel layers 121, 122, 123, and 124 to be in parallel with the gate electrode 165. The gate electrode 165 may be stably spaced apart from the source/drain regions 130 by the inner spacer layers 196, to be electrically isolated from each other. The inner spacer layers 196 may have a shape in which a side surface facing the gate electrode 165 is convexly rounded inwardly toward the gate electrode 165, but an example embodiment thereof is not limited thereto. The inner spacer layers 196 may be made of oxide, nitride, or oxynitride, and in particular, a low-k film. Referring to FIG. 5B, a semiconductor device 100e may not include an inner spacer layer 196, unlike in the example embodiment of FIG. 5A. In this case, the source/drain regions 130 may be disposed to expand in the X-direction between the first to fourth channel layers 121, 122, 123, and 124 and below the first channel layer 121. The gate electrodes 165 may be spaced apart from the source/drain regions 130 by gate dielectric layers 162. However, according to example embodiments, instead of the source/drain regions 130, the gate electrodes 165 may be disposed to expand in the X-direction.

According to this structure, the inner spacer layer 196 may be omitted, so that the source/drain regions 130 may have improved crystallinity when the source/drain regions 130 are grown. In some example embodiments, the inner spacer layer 196 may be omitted only in some devices of the semiconductor device 100e. For example, when SiGe is used for the source/drain regions 130 in a pFET, the inner spacer layer 196 may be selectively omitted only in the pFET in order to improve the crystallinity of SiGe.

The MBCFET™ structure as in the example embodiments of FIGS. 5A and 5B may also be applied to the example embodiments of FIGS. 3A to 4 and 8A and 8B.

Figure 6:
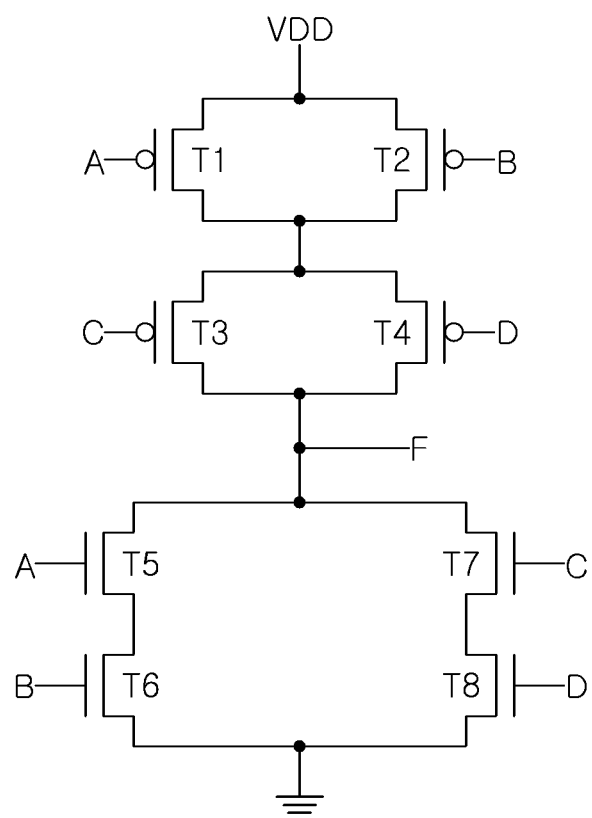
FIG. 6 is a circuit diagram of a unit circuit provided by a standard cell included in a semiconductor device, according to example embodiments.

FIG. 6 is a circuit diagram of a unit circuit provided by a standard cell included in a semiconductor device according to example embodiments.

Referring to FIG. 6, the unit circuit may be an AND-OR-Invert (AOI) circuit, and may be a circuit AOI22 to which two input signals are input to each AND gates. In the unit circuit, first and second elements T1 and T2 and third and fourth elements T3 and T4 respectively connected in parallel to each other, respectively, may be connected in series to provide an output terminal F. Fifth and sixth elements T5 and T6 and seventh and eighth elements T7 and T8 respectively connected in series with each other may be connected in parallel to provide the output terminal F together.

Gates of the first and fifth elements T1 and T5 may provide a first input terminal A, and gates of the second and sixth elements T2 and T6 may provide a second input terminal B. Also, gates of the third and seventh elements T3 and T7 may provide a third input terminal C, and gates of the fourth and eighth elements T4 and T8 may provide a fourth input terminal D.

However, the AOI22 circuit as shown in FIG. 6 is merely an example of unit circuits that the standard cell according to an example embodiment of the present inventive concept may provide, and the standard cells according to the example embodiment of the present inventive concept may provide various circuits in addition to these circuits.

Figure 7A:
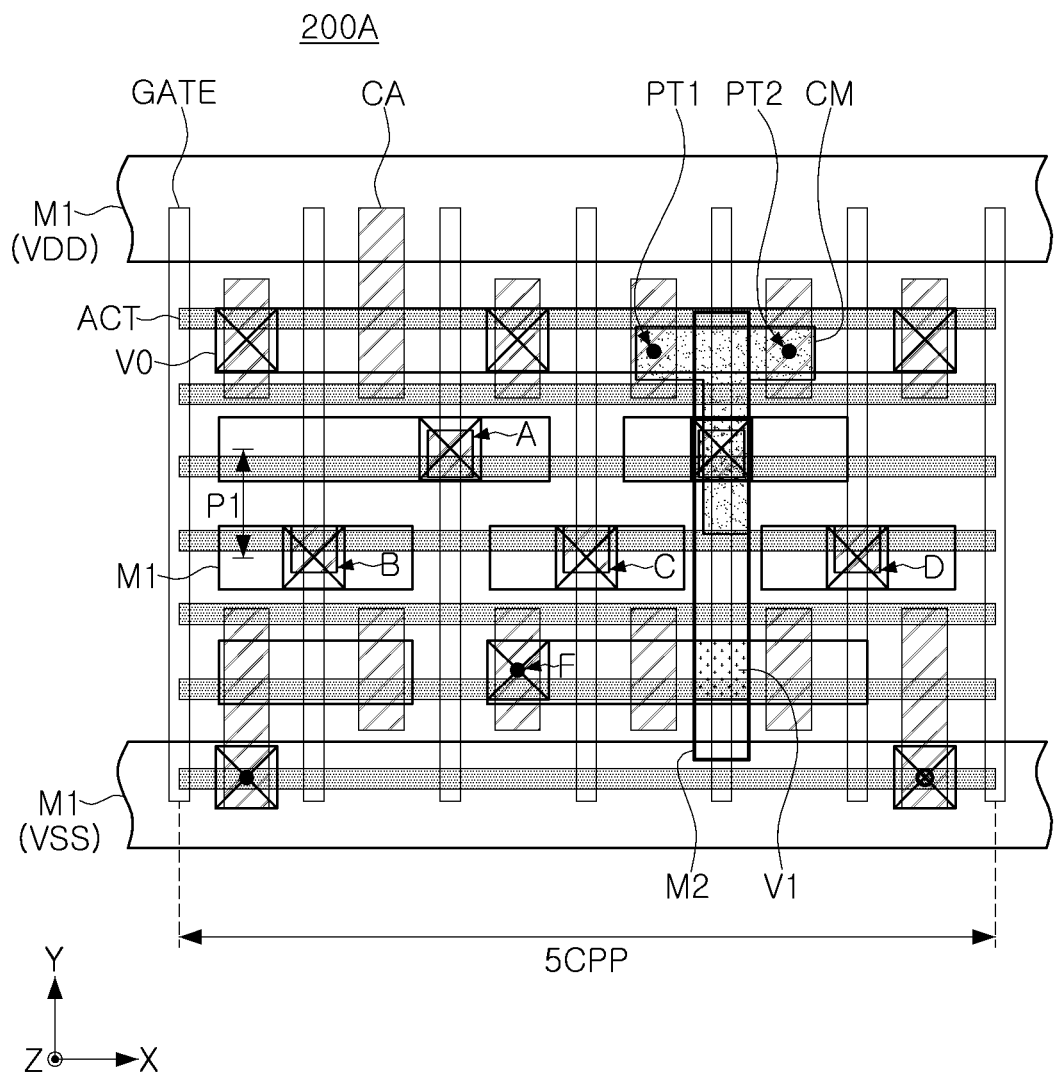
FIGS. 7A and 7B are schematic layout views of standard cells included in a semiconductor device according to Comparative Examples and Examples, respectively.
Figure 7B:
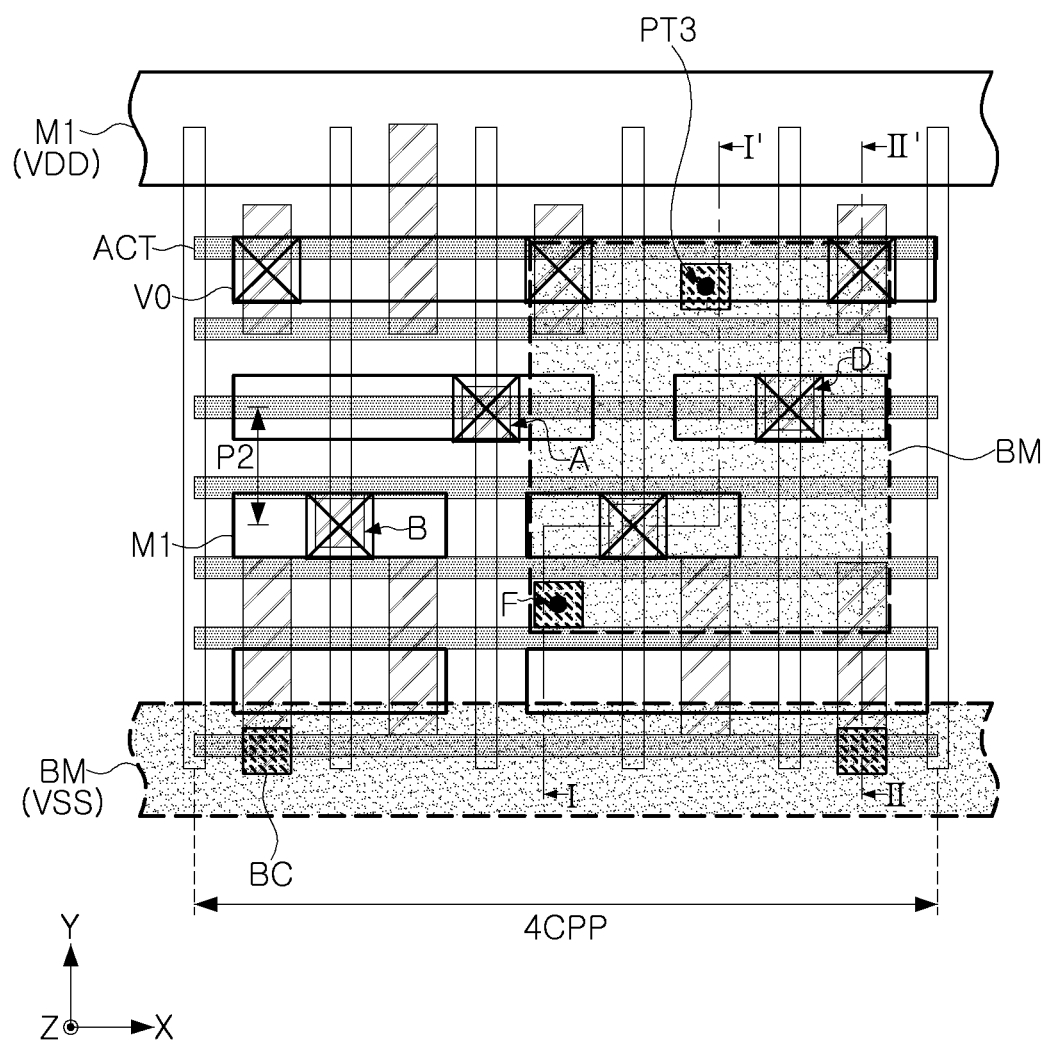

FIGS. 7A and 7B are schematic layout views of standard cells included in semiconductor devices according to Comparative Examples and Examples, respectively. FIGS. 7A and 7B illustrate a layout of a semiconductor device including the circuit of FIG. 6, and input terminals A to D and output terminals F of FIG. 6 are shown together.

Referring to FIGS. 7A and 7B, the semiconductor devices 200A and 200B may include the following components sequentially stacked. The semiconductor devices 200A and 200B may include active regions ACT extending lengthwise in an X direction, gate electrodes GATE extending lengthwise in a Y direction, upper contacts CA connected to the active regions ACT and the gate electrodes GATE, lower vias V0 connected to the upper contacts CA, and first interconnection lines M1 connected to the lower vias V0. The active regions ACT may include well regions including impurities of different conductivity types in upper and lower portions thereof based on a center line along a y-direction of FIGS. 7A and 7B.

The semiconductor device 200A of FIG. 7A may further include a connection interconnection CM connecting the upper contacts CA and the lower vias V0, upper vias V1 connected to the interconnection lines M1, and second interconnection lines M2 connected to the upper vias V1. The semiconductor device 200B of FIG. 7B may further include buried interconnection lines BM and lower contacts BC connected to the buried interconnection lines BM.

In the semiconductor devices 200A and 200B, the active region ACT, the gate electrode GATE, the upper contact CA, the lower via V0, and the first interconnection line M1 may correspond to the active region 105, the gate electrode 165, the upper contact plug 150, the via 170, and the upper interconnection line 185 of FIG. 1, respectively. Also, the buried interconnection line BM and the lower contact BC of the semiconductor device 200B may correspond to the buried interconnection line 180 and the lower contact plug 140 of FIG. 1, respectively.

In the semiconductor device 200A of FIG. 7A according to Comparative example, in electrically connecting a first point in time PT1 and a second point in time PT2 to connect the same to the output terminal F, first, upper contacts CA of the first point in time PT1 and the second point in time PT2 may be connected to each other by a connection interconnection CM. The connection interconnection CM may be connected to a second interconnection line M2 through the lower via V0 and the first interconnection line M1. The second interconnection line M2 may be connected to the active region ACT of the output terminal F through the upper contacts CA, the lower via V0, and the first interconnection line M1. In the semiconductor device 200A of FIG. 7A, one standard cell may have a width of 5 contacted poly pitch (CPP) by such a layout.

In the semiconductor device 200B of FIG. 7B according to an example embodiment, a point commonly corresponding to the first point in time PT1 and the second point in time PT2 of FIG. 7A may be indicated as a third point in time PT3, and the third point in time PT3 may be connected to a buried interconnection line BM through a lower contact BC. Also, the output terminal F may be connected to the buried interconnection line BM through the lower contact BC. In the semiconductor device 200A, the first interconnection lines M1 include power transmission lines M1 (VDD) and M1 (VSS), whereas in the semiconductor device 200B, at least one of the power transmission lines M1 (VDD) and M1 (VSS) may be disposed in a form of a buried interconnection line BM (VSS). Accordingly, in the semiconductor device 200B, a layout for connection with the output terminal F may be simplified, and the standard cell may have a reduced width of 4 CPP compared to the Comparative example.

The semiconductor device 200B may have a reduced width compared to the semiconductor device 200A, and in the semiconductor device 200B, a pitch between the first interconnection lines M1 may be increased. In the semiconductor device 200A, the first interconnection lines M1 have a first pitch P1, and in the semiconductor device 200B, the first interconnection lines M1 may have a second pitch P2, greater than the first pitch P1.

Figure 8A:
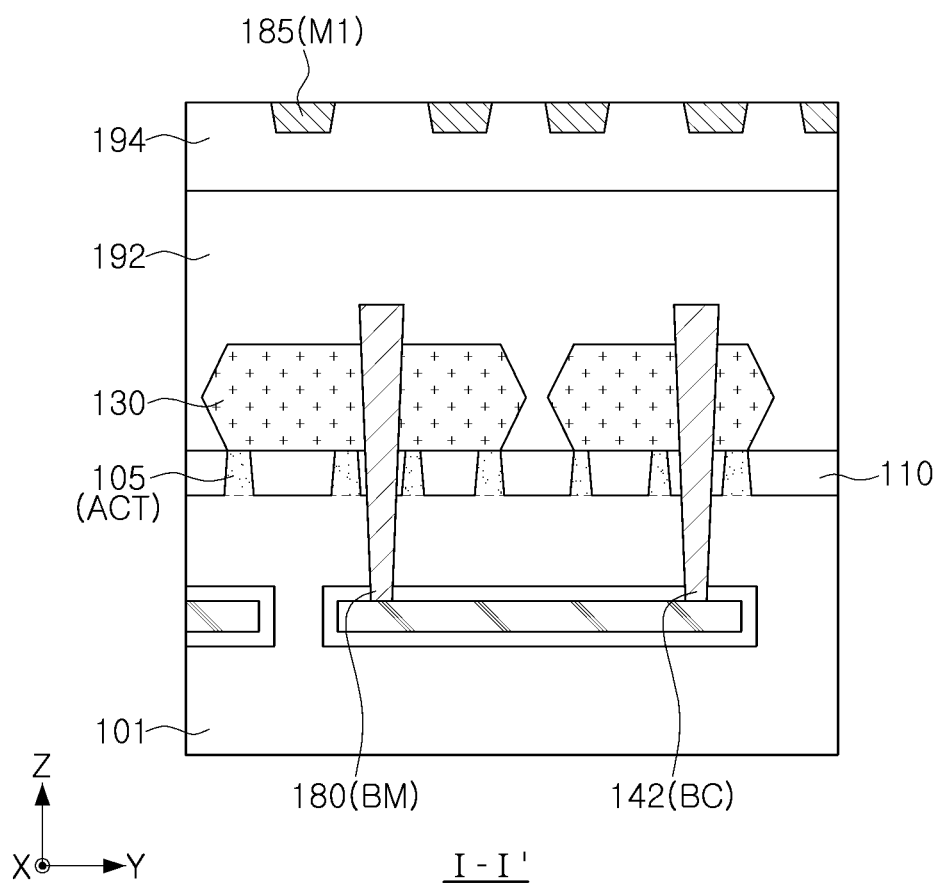
FIGS. 8A and 8B are schematic cross-sectional views of a semiconductor device, according to example embodiments.
Figure 8B:
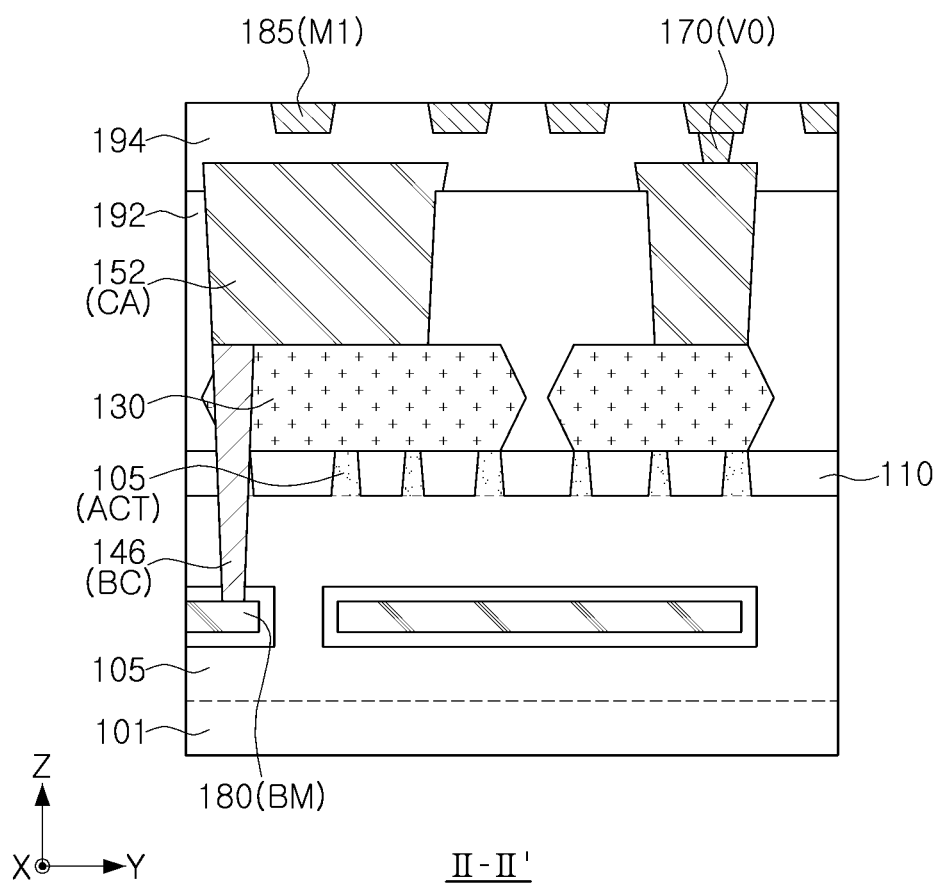

FIGS. 8A and 8B are schematic cross-sectional views of semiconductor devices according to example embodiments. FIGS. 8A and 8B are cross-sectional views of the semiconductor device of FIG. 7B taken along cutting lines I-I' and II-II'.

Referring to FIG. 8A, in a semiconductor device 200B, two first lower contact plugs 142 (BC) may be connected to a buried interconnection line 180 (BM), to form the output terminal F described above with reference to FIG. 7B. First lower contact plugs 142 (BC) may be connected to the source/drain regions 130.

Referring to FIG. 8B, in the semiconductor device 200B, a third lower contact plug 146 (BC) may be connected to a buried interconnection line 180 (BM). The buried interconnection line 180 (BM) may be an interconnection for power transmission as described above with reference to FIG. 7B. The third lower contact plug 146 (BC) may be connected to the source/drain region 130 and the first upper contact plug 152 (CA) at an upper end thereof.

However, in some example embodiments, a dispositional form of the source/drain regions 130 may be variously altered. For example, as in FIGS. 8A and 8B, the source/drain regions 130 may be respectively disposed in each of the active regions 105 (ACT), rather than in a merged source/drain form. In this case, the third lower contact plug 146 (BC) of FIG. 8B may be electrically connected to the adjacent source/drain region 130 through the first upper contact plug 152 (CA).

As described above, in the semiconductor device 200B, two points in a single standard cell may be connected using the buried interconnection line BM, or the standard cell may be connected to a power transmission line commonly connected to a plurality of standard cells using the buried interconnection line BM.

FIGS. 9A to 9J are views illustrating a process sequence in order to explain a method of manufacturing a semiconductor device according to example embodiments. An example embodiment of a method for manufacturing the semiconductor device of FIG. 1 will be described with reference to FIGS. 9A to 9J.

Figure 9A:
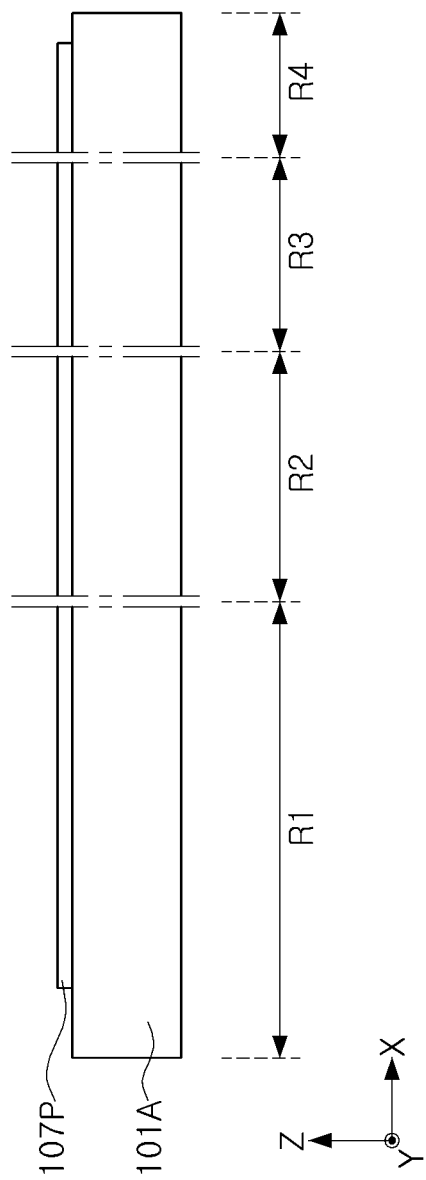
FIGS. 9A to 9J are views illustrating a process sequence in order to explain a method of manufacturing a semiconductor device, according to example embodiments.

Referring to FIG. 9A, a preliminary substrate insulating layer 107P may be formed on a lower substrate region 101A.

The lower substrate region 101A may be, for example, a semiconductor wafer. The preliminary substrate insulating layer 107P may be formed to be wider than the buried interconnection lines 180 (refer to FIG. 1) in a region where the buried interconnection lines 180 are to be disposed.

Figure 9B:
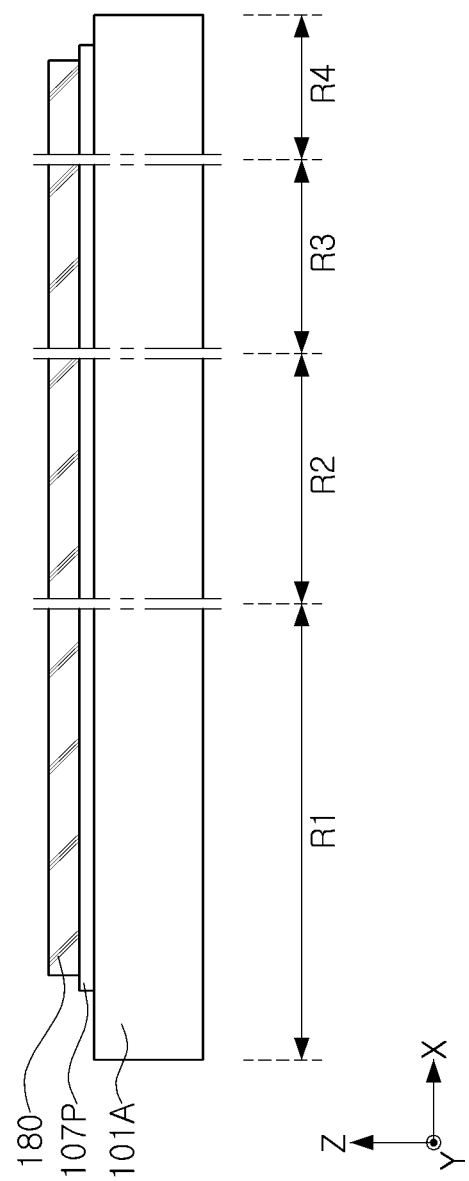

Referring to FIG. 9B, buried interconnection lines 180 may be formed on the preliminary substrate insulating layer 107P.

The buried interconnection lines 180 may be formed by, for example, depositing a conductive material and then patterning the same. For example, when the buried interconnection lines 180 are formed of ruthenium (Ru), the patterning process may be performed more easily than that of a metal material including copper (Cu).

Figure 9C:
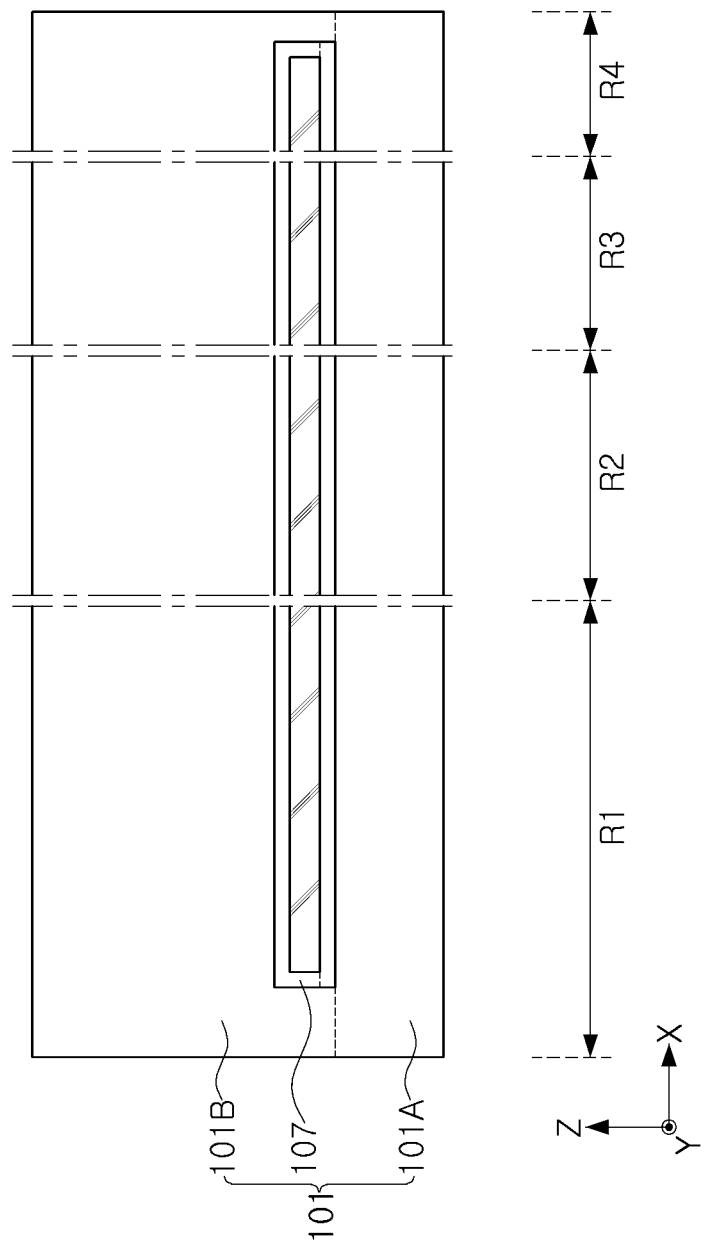

Referring to FIG. 9C, a substrate insulating layer 107 may be formed, and an upper substrate region 101B may be formed on a lower substrate region 101A to form a substrate 101.

First, an insulating material covering the buried interconnection lines 180 may be deposited on the preliminary substrate insulating layer 107P to form the substrate insulating layer 107. The substrate insulating layer 107 may have a structure covering an entire surface of the buried interconnection lines 180.

Next, the upper substrate region 101B may be formed by an epitaxial process using the lower substrate region 101A, whereby the substrate 101 may be formed. Alternatively, as in the example embodiment of FIG. 4, the substrate 101 may be formed by bonding a substrate such as a semiconductor wafer thereon.

Figure 9D:
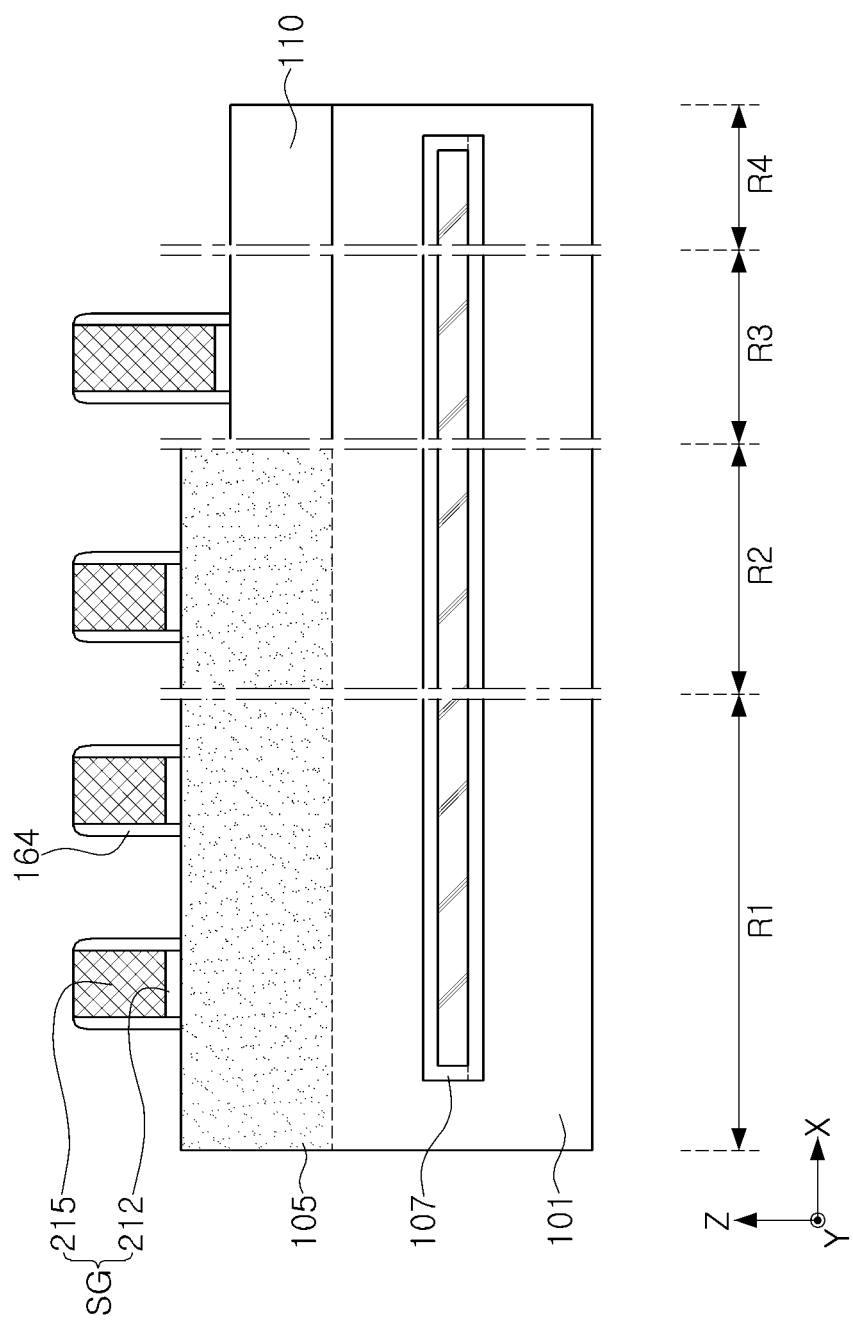

Referring to FIG. 9D, after removing a portion of the substrate 101 to form active regions 105 and a device isolation layer 110, sacrificial gate structures SG and gate spacer layers 164 may be formed.

First, the active regions 105 may be formed in a fin shape by partially removing the substrate 101 from an upper surface thereof. A lower end of the active region 105 may be formed above the buried interconnection lines 180. The active regions 105 may be formed in a line shape extending lengthwise in one direction, for example, in an X direction, and may be formed to be spaced apart from each other in a Y direction.

In a region from which a portion of the substrate 101 is removed, the device isolation layer 110 may be formed by filling an insulating material and then partially removing the insulating material so that the active regions 105 protrude. An upper surface of the device isolation layer 110 may be formed to be lower than the upper surface of the active regions 105, but a relative height may be variously altered in example embodiments.

Next, the sacrificial gate structures SG may be sacrificial structures formed in a region where the gate dielectric layer 162 and the gate electrode 165 of FIG. 1 are disposed through a subsequent process. The sacrificial gate structure SG may include first and second sacrificial gate layers 212 and 215 that are sequentially stacked. The first and second sacrificial gate layers 212 and 215 may be an insulating layer and a conductive layer, respectively, but example embodiments of the present inventive concept are not limited thereto, and the first and second sacrificial gate layers 212 and 215 may be formed as one layer. For example, the first sacrificial gate layer 212 may include silicon oxide, and the second sacrificial gate layer 215 may include polysilicon. The sacrificial gate structures SG may have a line shape intersecting the active regions 105 and extending lengthwise in one direction. The sacrificial gate structures SG may be disposed to extend, for example, in a Y direction and may be disposed to be spaced apart from each other in an X direction.

The gate spacer layers 164 may be formed on both sidewalls of the sacrificial gate structures SG. The gate spacer layers 164 may be made of a low-k material, and may include, for example, at least one of SiO, SiN, SiCN, SiOC, SiON, and SiOCN.

Figure 9E:
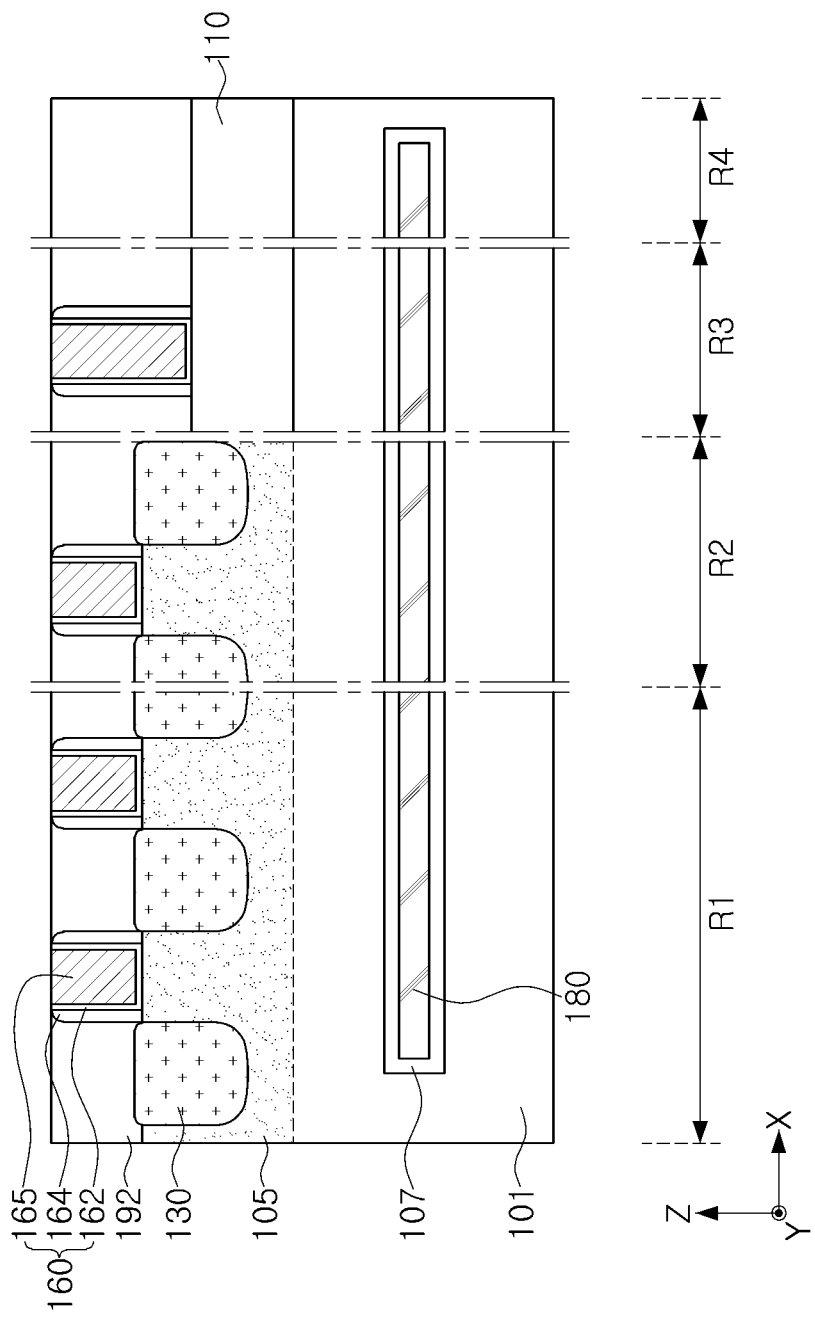

Referring to FIG. 9E, after partially removing the exposed active regions 105 and forming the source/drain regions 130 between the sacrificial gate structures SG, the sacrificial gate structures SG may be removed and gate structures 160 may be formed.

First, by using the sacrificial gate structures SG and the gate spacer layers 164 as masks, a portion of the active regions 105 may be removed to form recessed regions. The source/drain regions 130 may be formed by growing, for example, by a selective epitaxial process. The source/drain regions 130 may include impurities by in-situ doping, and may include a plurality of layers having different doping elements and/or doping concentrations. Next, a first interlayer insulating layer 192 may be partially formed and the sacrificial gate structures SG may be removed. The sacrificial gate structures SG may be removed by selectively etching the gate spacer layers 164 and the first interlayer insulating layer 192. Next, gate dielectric layers 162 and gate electrodes 165 may be formed in a region where the sacrificial gate structures SG are removed. The gate electrodes 165 may be planarized by a planarization process such as chemical mechanical polishing (CMP).

Figure 9F:
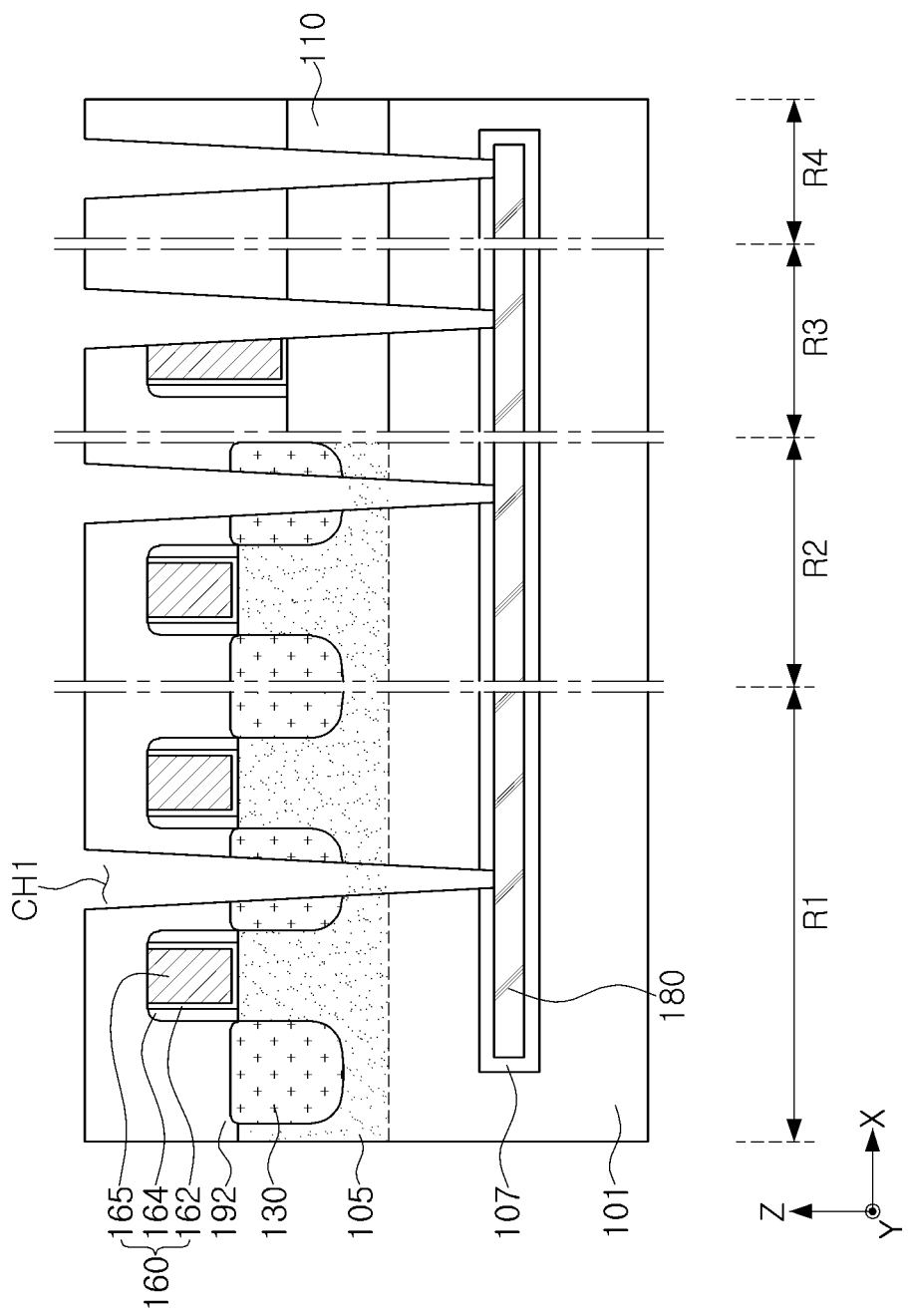

Referring to FIG. 9F, a first interlayer insulating layer 192 may be further formed, and first contact holes CH1 may be formed.

The first interlayer insulating layer 192 may be formed by forming an insulating film covering the sacrificial gate structures SG and the source/drain regions 130 and performing a planarization process.

First contact holes CH1 may be formed to correspond to the lower contact plugs 140 of FIG. 1. The first contact holes CH1 may be formed to penetrate through a portion of the first interlayer insulating layer 192, the source/drain regions 130, the gate structure 160, and the device isolation layer 110 depending on the region, to expose the buried interconnection lines 180. For example, in a region in which the first lower contact plugs 142 are disposed, the first contact holes CH1 may include an upper trench region and lower hole regions. According to example embodiments, the first contact holes CH1 may be formed to gradually increase in depth by a plurality of etching processes.

Figure 9G:
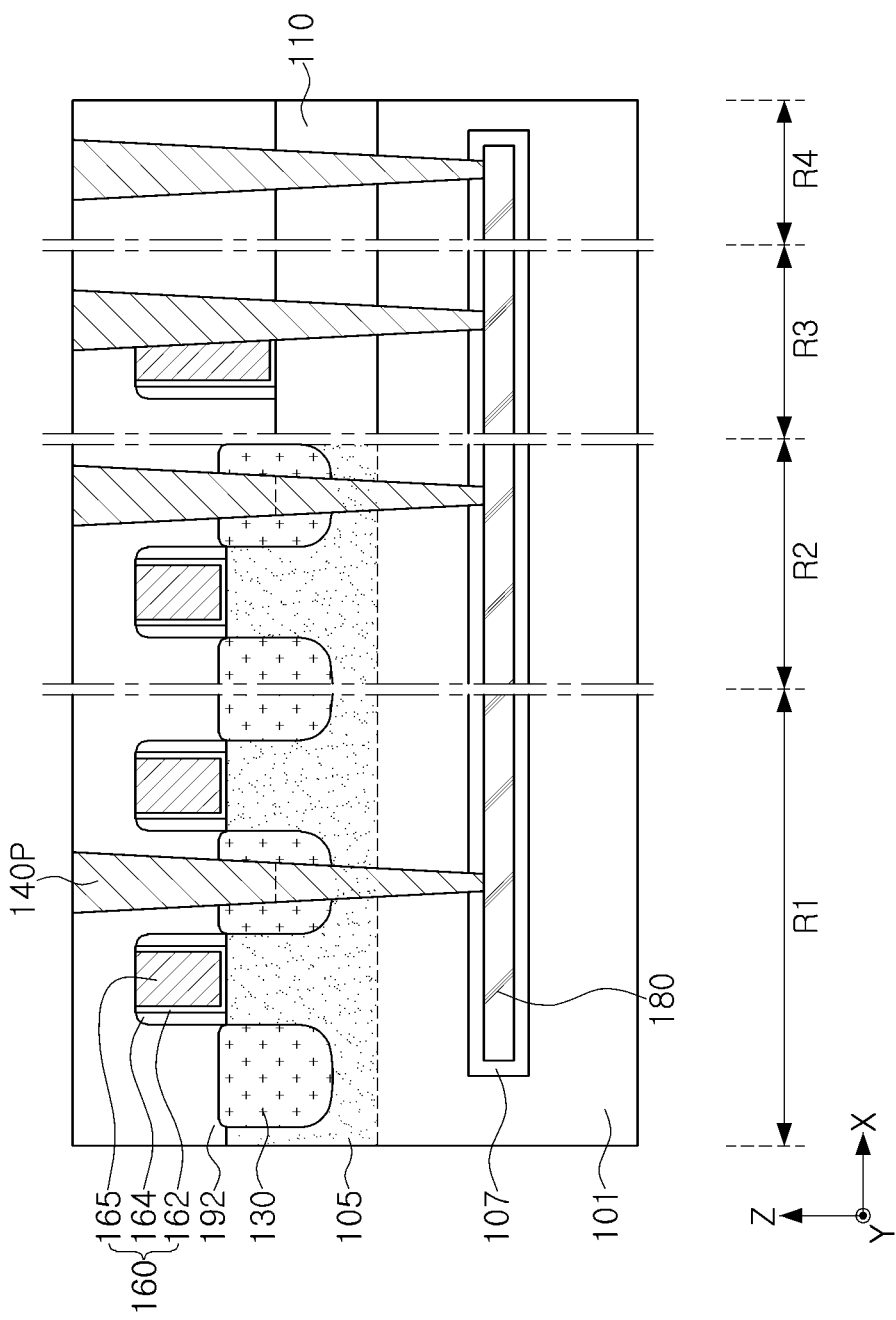

Referring to FIG. 9G, preliminary lower contact plugs 140P may be formed by filling the first contact holes CH1 with a conductive material.

The preliminary lower contact plugs 140P may include, for example, tungsten (W) or cobalt (Co). The preliminary lower contact plugs 140P may be formed to entirely fill each of the first contact holes CH1.

Figure 9H:
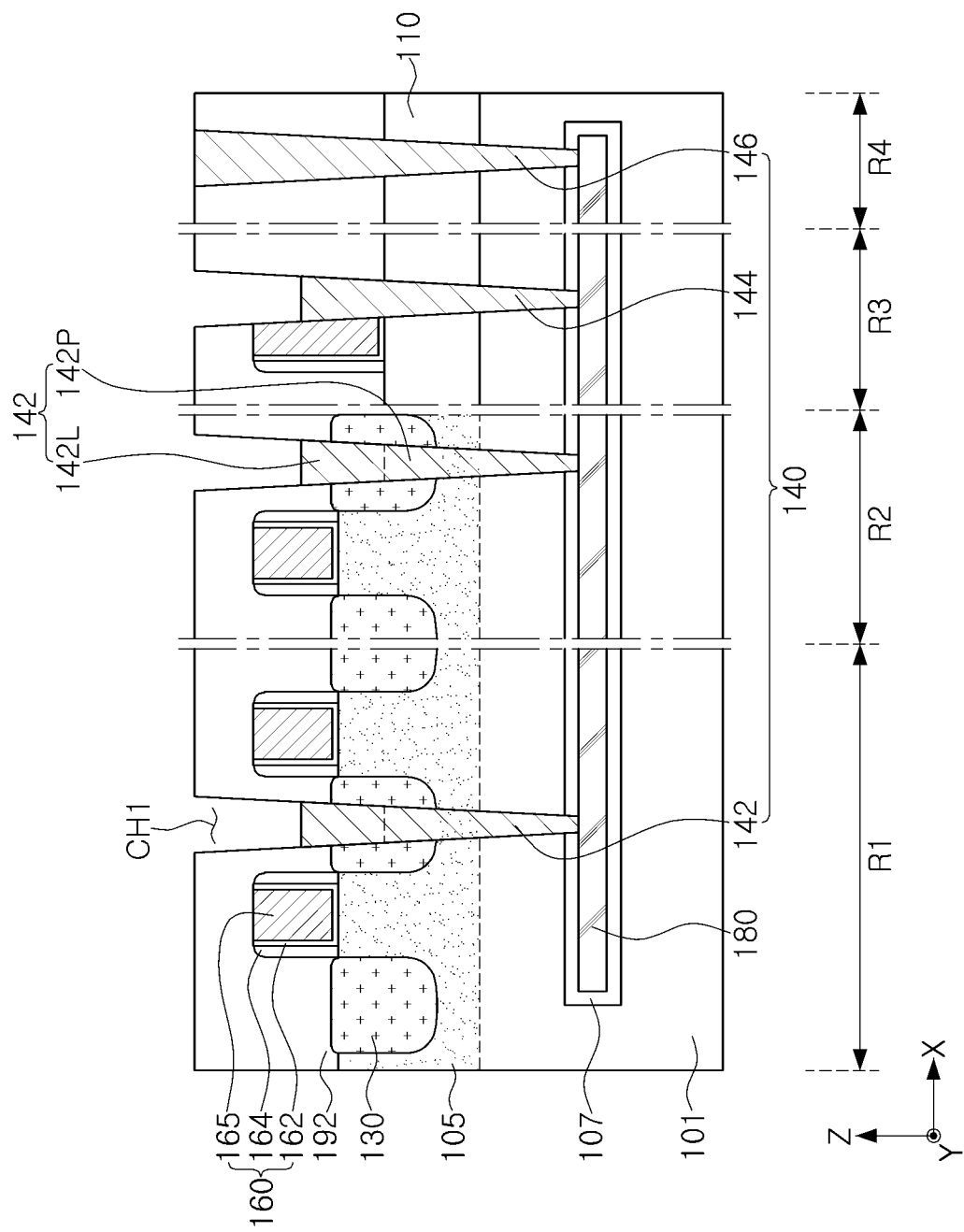

Referring to FIG. 9H, the preliminary lower contact plugs 140P may be partially removed in the first contact holes CH1 to form lower contact plugs 140.

The preliminary lower contact plugs 140P may be partially recessed and removed from the upper surfaces in a region in which the first and second lower contact plugs 142 and 144 are formed. Accordingly, the first and second lower contact plugs 142 and 144 may be formed to have a height smaller than that of the third lower contact plug 146.

In the case of the example embodiments of FIGS. 3A and 3B, in the present step, it may be manufactured by changing a recess depth of the preliminary lower contact plugs 140P.

Figure 9I:
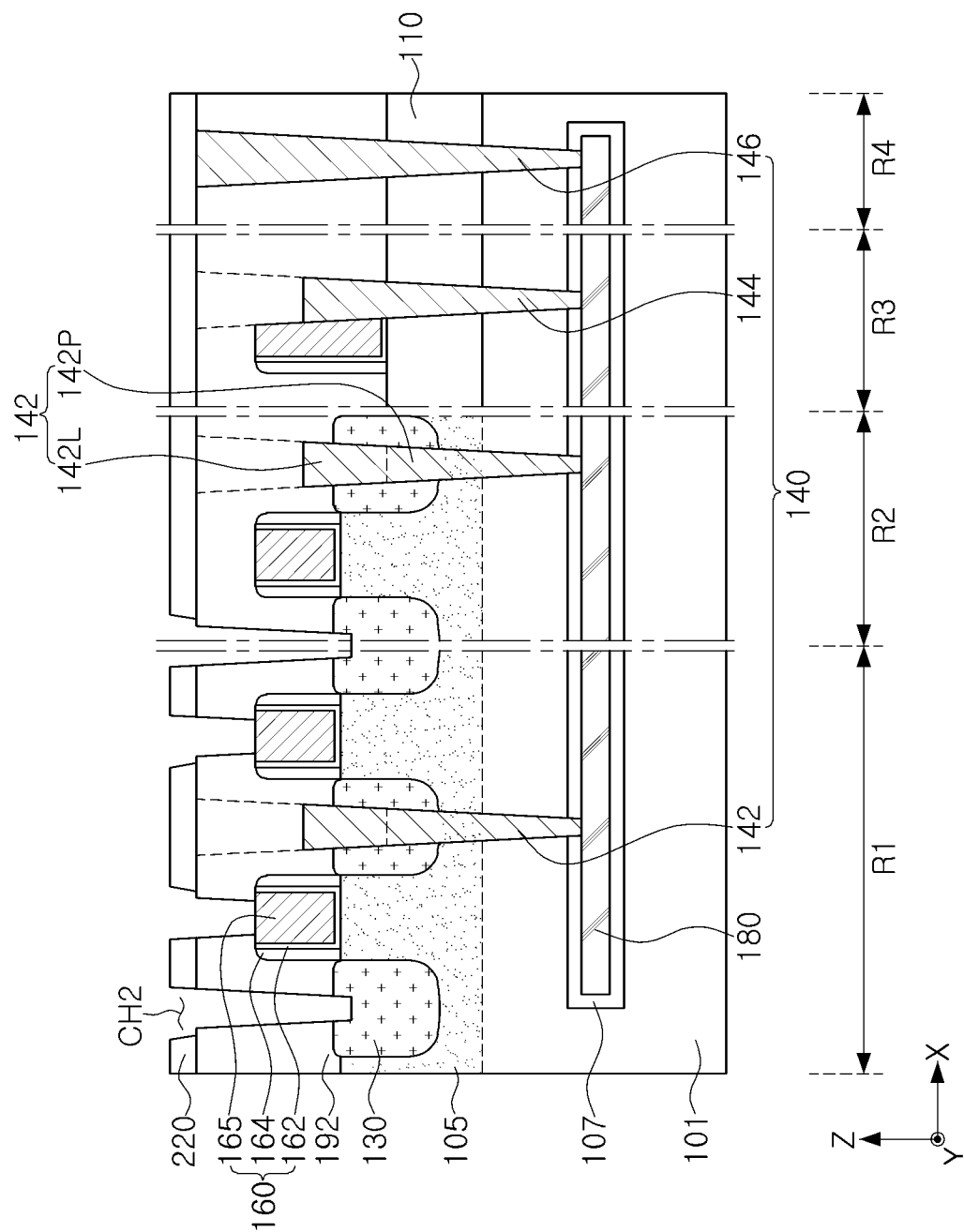

Referring to FIG. 9I, the sacrificial dielectric layer 220 may be formed on a first interlayer insulating layer 192, and second contact holes CH2 may be formed.

First, a first interlayer insulating layer 192 may be additionally formed to fill the first contact holes CH1. The sacrificial dielectric layer 220 may include a material different from that of the first interlayer insulating layer 192.

The second contact holes CH2 may be formed to correspond to the upper contact plugs 150 of FIG. 1. The second contact holes CH2 may be formed to penetrate through the sacrificial dielectric layer 220 and the first interlayer insulating layer 192 to expose the source/drain regions 130 and the gate electrode 165. The second contact holes CH2 may be formed to have an extended width in the sacrificial dielectric layer 220 by controlling an etching process condition. For example, a width of the second contact holes CH2 may be greater at the level of the sacrificial dielectric layer 220 than a width of the second contact holes CH2 at a level of the first interlayer insulating layer 192.

Figure 9J:
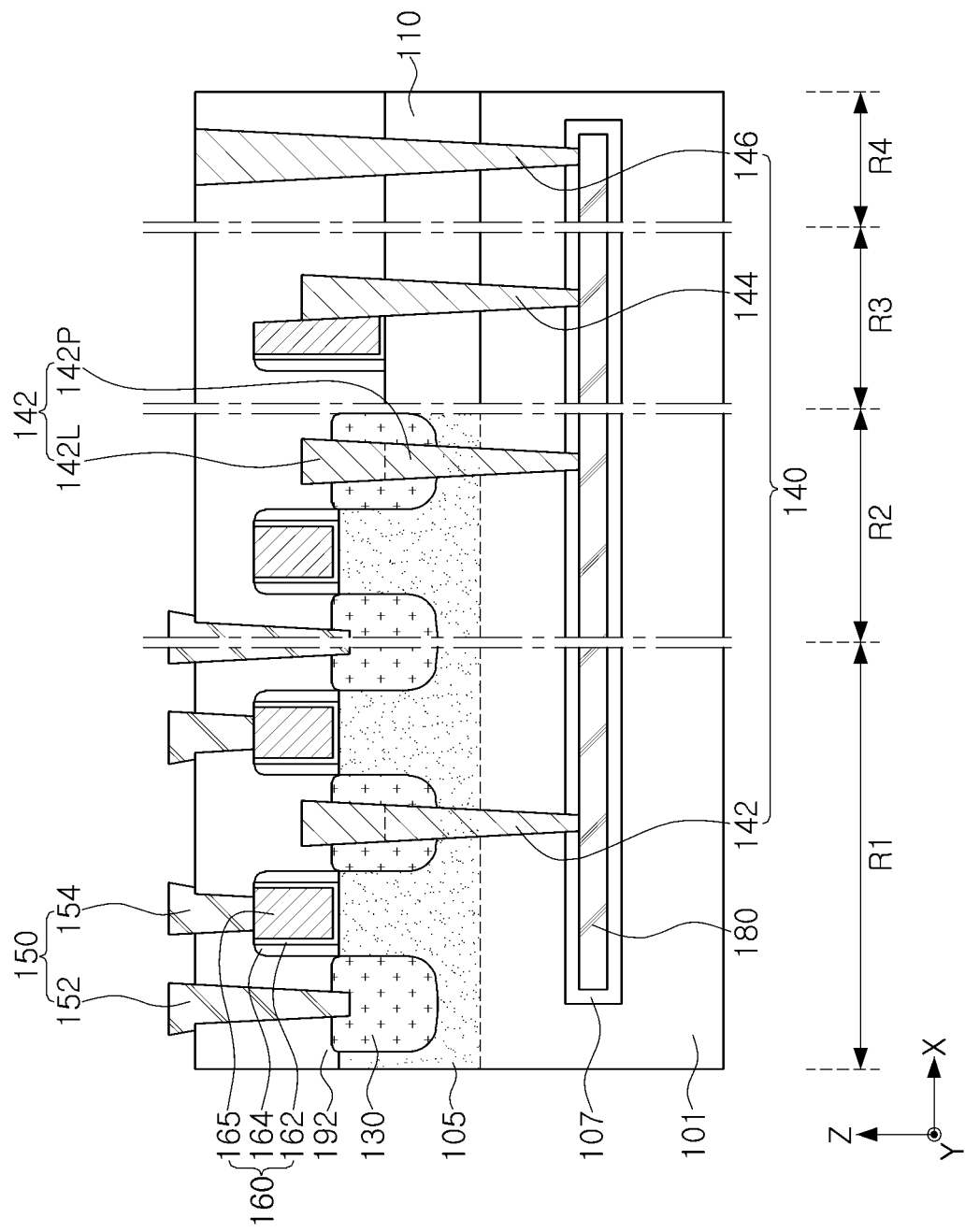

Referring to FIG. 9J, the second contact holes CH2 may be filled with a conductive material to form upper contact plugs 150, and the sacrificial dielectric layer 220 may be removed.

The upper contact plugs 150 may include, for example, tungsten (W) or cobalt (Co). The upper contact plugs 150 may be formed to fill the entire second contact holes CH2. The sacrificial dielectric layer 220 may be selectively removed with respect to the first interlayer insulating layer 192.

Next, referring to FIG. 1, a second interlayer insulating layer 194 may be formed, and vias 170 and upper interconnection lines 185 may be formed.

The vias 170 may be formed by patterning the second interlayer insulating layer 194 to form via holes exposing the upper contact plugs 150 and the third lower contact plug 146, and filling the via holes with a conductive material. The upper interconnection lines 185 may be formed in a line shape on the vias 170. Accordingly, the semiconductor device 100 of FIG. 1 may be manufactured.

As set forth above, according to the present inventive concept, by optimizing a structure of a buried interconnection line and lower contact plugs connected thereto, a semiconductor device having improved a degree of integration and reliability may be provided.

While example embodiments have been shown and described above, it will be apparent to those skilled in the art that modifications and variations could be made without departing from the scope of the present inventive concept as defined by the appended claims.

What is claimed is:

1. A semiconductor device, comprising;
a substrate including active regions extending in a first direction;
gate electrodes extending in a second direction, intersecting the active regions on the substrate;
source/drain regions disposed in regions in which the active regions are recessed on both sides of the gate electrodes;
buried interconnection lines disposed in the substrate;
a first lower contact plug penetrating through a portion of the substrate, and connecting at least one source/drain region of the source/drain regions and at least one of the buried interconnection lines;
a second lower contact plug penetrating through a portion of the substrate, and connecting at least one gate electrode of the gate electrodes and at least one of the buried interconnection lines; and
upper contact plugs connected to a portion of the source/drain regions and a portion of the gate electrodes on the substrate,
wherein levels of upper surfaces of the first and second lower contact plugs are lower than a level of upper surfaces of the gate electrodes.

2. The semiconductor device of claim 1, wherein the levels of the upper surfaces of the first and second lower contact plugs are lower than a level of upper surfaces of the upper contact plugs.

3. The semiconductor device of claim 1,
wherein the active regions comprise active fins, and
wherein a level of upper surfaces of the buried interconnection lines are lower than a level of lower ends of the active fins.

4. The semiconductor device of claim 1, wherein the level of the upper surface of the first lower contact plug is higher than a level of lower surfaces of the source/drain regions.

5. The semiconductor device of claim 1, wherein the first lower contact plug vertically penetrates an entirety of the at least one source/drain region connected to the first lower contact plug.

6. The semiconductor device of claim 1, wherein the level of the upper surface of the first lower contact plug is lower than a level of upper surfaces of the source/drain regions.

7. The semiconductor device of claim 1, wherein the second lower contact plug is in contact with a side surface of the at least one gate electrode connected to the second lower contact plug.

8. The semiconductor device of claim 7, wherein the at least one gate electrode has a shape in which a portion thereof is removed from a region connected to the second lower contact plug.

9. The semiconductor device of claim 1, wherein a depth from an upper surface of the substrate to upper surfaces of the buried interconnection lines is in a range of about 10 nm to about 200 nm.

10. The semiconductor device of claim 1, further comprising:
a substrate insulating layer disposed in the substrate to surround the buried interconnection lines.

11. The semiconductor device of claim 10,
wherein the substrate insulating layer horizontally extends externally of the buried interconnection lines, and
wherein the semiconductor device further comprises a bonding insulating layer on the substrate insulating layer.

12. The semiconductor device of claim 1, wherein a width of upper surfaces of the upper contact plugs is greater than a width of lower surfaces of the upper contact plugs.

13. The semiconductor device of claim 1, further comprising:
a third lower contact plug connected to at least one of the buried interconnection lines, and having an upper surface disposed on a level higher than the levels of the upper surfaces of the first and second lower contact plugs.

14. The semiconductor device of claim 13, further comprising:
vias on the upper contact plugs and the third lower contact plug; and
upper interconnection lines on the vias,
wherein the third lower contact plug is connected to one of the vias.

15. The semiconductor device of claim 1, further comprising:
a plurality of channel layers disposed on each of the active regions, to be spaced apart from each other in a third direction, perpendicular to an upper surface of the substrate and surrounded by each of the gate electrodes.

16. A semiconductor device, comprising:
a substrate including active regions spaced apart from each other and extending in a first direction;
gate electrodes extending in a second direction, intersecting the active regions on the substrate;
source/drain regions disposed in regions in which the active regions are recessed on both sides of the gate electrodes and including first and second source/drain regions;
a first buried interconnection line disposed in the substrate;
a first lower contact plug penetrating through a portion of the substrate, and contacting the first source/drain region and the first buried interconnection line; and
an upper contact plug connected to the second source/drain region on the substrate,
wherein a level of an upper surface of the first lower contact plug is lower than a level of upper surfaces of the gate electrodes, and a level of an upper surface of the upper contact plug is higher than the level of the upper surfaces of the gate electrodes.

17. The semiconductor device of claim 16, further comprising:
a second buried interconnection line disposed in the substrate, and
a second lower contact plug penetrating through a portion of the substrate, and connecting at least one of the gate electrodes and at least one of the first and second buried interconnection lines.

18. The semiconductor device of claim 16,
wherein the active regions comprise active fins protruding upwardly,
wherein the semiconductor device further comprises a device isolation layer filling a space between the active fins, and
wherein a level of an upper surface of the first buried interconnection line is lower than a level of lower ends of the active fins.

19. A semiconductor device, comprising:
a substrate including active regions extending in a first direction;
gate electrodes extending in a second direction, intersecting the active regions on the substrate;
source/drain regions disposed in regions in which the active regions are recessed on both sides of the gate electrodes;
buried interconnection lines disposed in the substrate;
upper interconnection lines disposed on the substrate, and including a power transmission line;
a first lower contact plug penetrating through a portion of the substrate, and connecting at least one of the source/drain regions and at least one of the buried interconnection lines;
a second lower contact plug penetrating through a portion of the substrate, and connecting at least one of the gate electrodes and at least one of the buried interconnection lines;
a third lower contact plug penetrating through a portion of the substrate, and connecting the power transmission line and at least one of the buried interconnection lines; and
upper contact plugs connected to a portion of the source/drain regions and a portion of the gate electrodes on the substrate,
wherein levels of upper surfaces of the first and second lower contact plugs are lower than a level of an upper surface of the third lower contact plug.

20. The semiconductor device of claim 19,
wherein the levels of the upper surfaces of the first and second lower contact plugs are lower than a level of upper surfaces of the upper contact plugs, and
wherein the upper surface of the third lower contact plug is disposed between the upper surfaces of the upper contact plugs and the upper surfaces of the first and second lower contact plugs.

* * * * *